United States Patent
Miyagi et al.

(10) Patent No.: US 11,780,948 B2
(45) Date of Patent: Oct. 10, 2023

(54) RESIN COMPOSITION FOR FORMING PHASE-SEPARATED STRUCTURE, METHOD FOR PRODUCING STRUCTURE INCLUDING PHASE-SEPARATED STRUCTURE, AND BLOCK COPOLYMER

(71) Applicants: TOKYO OHKA KOGYO CO., LTD., Kawasaki (JP); NATIONAL UNIVERSITY CORPORATION HOKKAIDO UNIVERSITY, Hokkaido (JP)

(72) Inventors: Ken Miyagi, Kawasaki (JP); Takahiro Dazai, Kawasaki (JP); Toshifumi Satoh, Hokkaido (JP); Takuya Isono, Hokkaido (JP); Shunma Tanaka, Hokkaido (JP)

(73) Assignees: Tokyo Ohka Kogyo Co., Ltd., Kawasaki (JP); National University Corporation Hokkaido University, Sapporo (JP)

( * ) Notice: Subject to any disclaimer, the term of this patent is extended or adjusted under 35 U.S.C. 154(b) by 179 days.

(21) Appl. No.: 17/152,258

(22) Filed: Jan. 19, 2021

(65) Prior Publication Data
US 2021/0230340 A1    Jul. 29, 2021

(30) Foreign Application Priority Data
Jan. 24, 2020    (JP) .................. 2020-010090

(51) Int. Cl.
*B05D 3/02*    (2006.01)
*C08F 299/02*    (2006.01)
(Continued)

(52) U.S. Cl.
CPC ........ *C08F 299/024* (2013.01); *B05D 3/0254* (2013.01); *C08F 212/08* (2013.01);
(Continued)

(58) Field of Classification Search
CPC .. B05D 3/0254; C08F 299/024; C08F 212/08; C08L 25/08; C08L 33/12; C08L 53/00; G03F 7/002
(Continued)

(56) References Cited

U.S. PATENT DOCUMENTS 5,679,762 A * 10/1997 Yoshida ................. C09J 153/00
                                                 528/364
9,169,421 B2 * 10/2015 Matsumiya ............. C08G 18/61
(Continued)

FOREIGN PATENT DOCUMENTS

| JP | 2008-036491 A | 2/2008 |
| JP | 2014-521790 A | 8/2014 |
| WO | WO 2013/019679 A1 | 2/2013 |

OTHER PUBLICATIONS

Hinsberg et al., "Self-Assembling Material for Lithgraphic Patterning: Overview, Status and Moving Forward." Proceedings of SPIE, vol. 7637, 76370G-1 to 76370G-11, 2010.

*Primary Examiner* — Brian K Talbot
(74) *Attorney, Agent, or Firm* — Knobbe, Martens, Olson & Bear, LLP

(57) ABSTRACT

A resin composition for forming a phase-separated structure includes a block copolymer having a block (b1) formed of a repeating structure of styrene units, the block (b1) being partially substituted with a constituent unit represented by the following General Formula (c1) and a block (b2) having a repeating structure of methyl methacrylate units. In the formula, R is a hydrogen atom or a methyl group and $R^{c0}$ is a hydrophobic functional group (Continued)

US 11,780,948 B2
Page 2

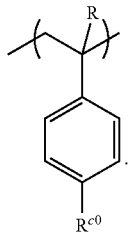

4 Claims, 4 Drawing Sheets

(51) Int. Cl.
  *C08L 33/12* (2006.01)
  *C08L 25/08* (2006.01)
  *G03F 7/00* (2006.01)
  *C08F 212/08* (2006.01)
  *C08L 53/00* (2006.01)
(52) U.S. Cl.
  CPC ............... *C08L 25/08* (2013.01); *C08L 33/12* (2013.01); *C08L 53/00* (2013.01); *G03F 7/0002* (2013.01)

(58) Field of Classification Search
  USPC .......................................................... 427/270
  See application file for complete search history.

(56) References Cited

U.S. PATENT DOCUMENTS

| | | | |
|---|---|---|---|
| 9,206,307 B2 * | 12/2015 | Matsumiya | B82B 3/00 |
| 9,567,477 B2 * | 2/2017 | Seshimo | C08F 212/08 |
| 9,816,003 B2 * | 11/2017 | Kurosawa | C09D 153/00 |
| 11,466,114 B2 * | 10/2022 | Miyagi | C08F 293/005 |
| 2013/0029113 A1 * | 1/2013 | Nealey | C08F 8/08 |
| | | | 525/122 |
| 2014/0238956 A1 * | 8/2014 | Namie | H01L 21/0337 |
| | | | 525/299 |
| 2015/0187581 A1 * | 7/2015 | Komatsu | C09D 125/14 |
| | | | 430/285.1 |
| 2015/0301445 A1 * | 10/2015 | Komatsu | G03F 7/2006 |
| | | | 216/49 |
| 2015/0376454 A1 * | 12/2015 | Zhang | B05D 3/007 |
| | | | 427/379 |
| 2016/0291461 A1 * | 10/2016 | Yoshida | G03F 7/2004 |
| 2020/0040209 A1 * | 2/2020 | Komatsu | G03F 7/0002 |
| 2022/0236639 A1 * | 7/2022 | Huli | C08L 25/06 |

* cited by examiner

RESIN COMPOSITION FOR FORMING PHASE-SEPARATED STRUCTURE, METHOD FOR PRODUCING STRUCTURE INCLUDING PHASE-SEPARATED STRUCTURE, AND BLOCK COPOLYMER

BACKGROUND OF THE INVENTION

Field of the Invention

The present invention relates to a resin composition for forming a phase-separated structure, a method for producing a structure including a phase-separated structure, and a block copolymer.

Priority is claimed on Japanese Patent Application No. 2020-010090, filed on Jan. 24, 2020, the content of which is incorporated herein by reference.

Description of Related Art

In recent years, following further miniaturization of a large-scale integrated circuit (LSI), a technique for processing finer structures has been demanded.

For such a demand, there has been developed a technique for forming finer patterns by utilizing a phase-separated structure formed by the self-organization of the block copolymers in which incompatible blocks are bonded to each other (see, for example, Japanese Unexamined Patent Application, Publication No. 2008-36491).

In order to utilize the phase-separated structure of the block copolymer, it is essential to form the self-organized nanostructures, which are formed by microphase separation, only in a specific region and arrange the nanostructures in the desired direction. In order to realize these position control and orientation control, processes such as grapho-epitaxy for controlling the phase separation pattern by the guide patterns and chemical epitaxy for controlling the phase separation pattern by the difference in the chemical state of the substrate have been proposed (See, for example, Proceedings of SPIE, Vol. 7637, No. 76370G-1, 2010).

The block copolymer forms a structure having a regular periodic structure by the phase separation.

The "period of a structure" means the period of the phase structure observed when the structure of a phase-separated structure is formed and refers to the sum of the lengths of the respective phases incompatible with each other. In a case where the phase-separated structure forms a lamella structure perpendicular to the substrate surface, the period (L0) of the structure is a sum of the lengths two adjacent phases.

It is known that the period (L0) of the structure is determined by inherent polymerization properties such as the degree of polymerization N and interaction parameter $\chi$ of Flory-Huggins. That is, the larger the product "$\chi \times N$" of c and N is, the greater the mutual repulsion between the different blocks in the block copolymer becomes. Therefore, in a case of the relation of $\chi \times N > 10$ (hereinafter, referred to as "strong separation limit"), the repulsion between the different kinds of blocks in the block copolymer is large, and the tendency for phase separation to occur becomes strong. Accordingly, in the strong separation limit, the period of the structure is approximately $N^{2/3} \times \chi^{1/6}$, and satisfies the relationship of the following equation (1). That is, the period of the structure is proportional to the degree of polymerization N, which correlates with the molecular weight and the molecular weight ratio between the different blocks.

$$L0 \propto a \times N^{2/3} \times \chi^{1/6} \tag{1}$$

[In the formula, L0 represents a period of the structure. a is a parameter indicating the size of the monomer. N represents a degree of polymerization. $\chi$ is an interaction parameter, and the higher the value thereof, the higher the phase separation performance.]

Accordingly, the period (L0) of the structure can be controlled by adjusting the composition and the total molecular weight of the block copolymer.

It is known that the periodic structure which the block copolymer forms varies the form such as a cylinder (columnar phase), a lamella (plate phase), and a sphere (spherical phase) depending on the volume ratio of the polymer components, and the period depends on the molecular weight. Therefore, a method for increasing the molecular weight of the block copolymers can be considered in order to form the structure of a relatively large period (L0) by utilizing the phase-separated structure formed by the self-organization of the block copolymers.

It is also conceivable to use a method for using a block copolymer having a larger interaction parameter (c) than that of a block copolymer having a block of styrene and a block of methyl methacrylate, which is a general-purpose block copolymer. For example, PCT Japanese Translation Patent, Publication No. 2014-521790 proposes a composition including a block copolymer in which approximately 50% to 90% of a polyisoprene block of a poly(styrene-b-isoprene) block copolymer has been modified with an epoxy functional group.

PRIOR ART DOCUMENT

[Patent Document]
[Patent Document 1] Japanese Unexamined Patent Application, First Publication No. 2008-36491
[Patent Document 2] PCT Japanese Translation Patent, Publication No. 2014-521790

Non-Patent Document

[Non-Patent Document 1] Proceedings of SPI, Vol. 7637, No. 76370G-1 (2010).

SUMMARY OF THE INVENTION

However, at present, it is difficult to further improve the phase separation performance in forming a structure by utilizing a phase-separated structure formed by the self-organization of a block copolymer having a block of styrene and a block of methyl methacrylate, which is a general-purpose block copolymer.

In the composition described in PCT Japanese Translation Patent, Publication No. 2014-521790, a new monomer (isoprene) is required for producing the block copolymer. With the adoption of this new monomer, it is necessary to set new reaction conditions in order to achieve the narrow dispersion of the block copolymer.

It is also conceivable to use a block copolymer having a small molecular weight in order to form a finer pattern. However, in this case, there is a problem that N (degree of polymerization) in the above formula (1) decreases and phase separation does not occur.

The present invention has been made in view of the above circumstances, and an object of the invention is to provide a resin composition for forming a phase-separated structure, which can further improve the phase separation performance without requiring a new monomer, a method for producing a structure including a phase-separated structure, and a block copolymer, which can be used in the production of the resin composition for forming a phase-separated structure.

The present inventors have found a method for increasing a pro-hydrophobic difference between a hydrophobic block portion and a hydrophilic block portion in the phase-separated structure larger by using a block copolymer (PS-b-PMMA) having a block of styrene and a block of methyl methacrylate, which is a general-purpose block copolymer, without requiring a new monomer besides styrene and methyl methacrylate, thereby completing the present invention.

That is, a first aspect of the present invention is a resin composition for forming a phase-separated structure including a block copolymer having a block (b1) formed of a repeating structure of styrene units, the block (b1) being partially substituted with a constituent unit represented by the following General Formula (c1) and a block (b2) having a repeating structure of methyl methacrylate units.

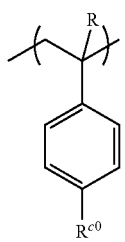

(c1)

[In the formula, R is a hydrogen atom or a methyl group. $R^{c0}$ is a hydrophobic functional group.]

A second aspect of the invention is a method for producing a structure including a phase-separated structure including: a step of applying a resin composition for forming a phase-separated structure according to the first aspect on a support to form a layer including a block copolymer; and a step of phase-separating the layer including the block copolymer.

A third aspect of the present invention is a block copolymer having a block (b1) formed of a repeating structure of styrene units, the block (b1) being partially substituted with a constituent unit represented by the following General Formula (c1) and a block (b2) having a repeating structure of methyl methacrylate units.

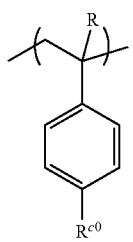

(c1)

[In the formula, R is a hydrogen atom or a methyl group. $R^{c0}$ is a hydrophobic functional group.]

According to the invention, it is possible to provide a resin composition for forming a phase-separated structure, which can further improve the phase separation performance without requiring a new monomer, a method for producing a structure including a phase-separated structure, and a block copolymer, which is used in the production of the resin composition for forming a phase-separated structure.

DETAILED DESCRIPTION OF THE INVENTION

Figure 1:
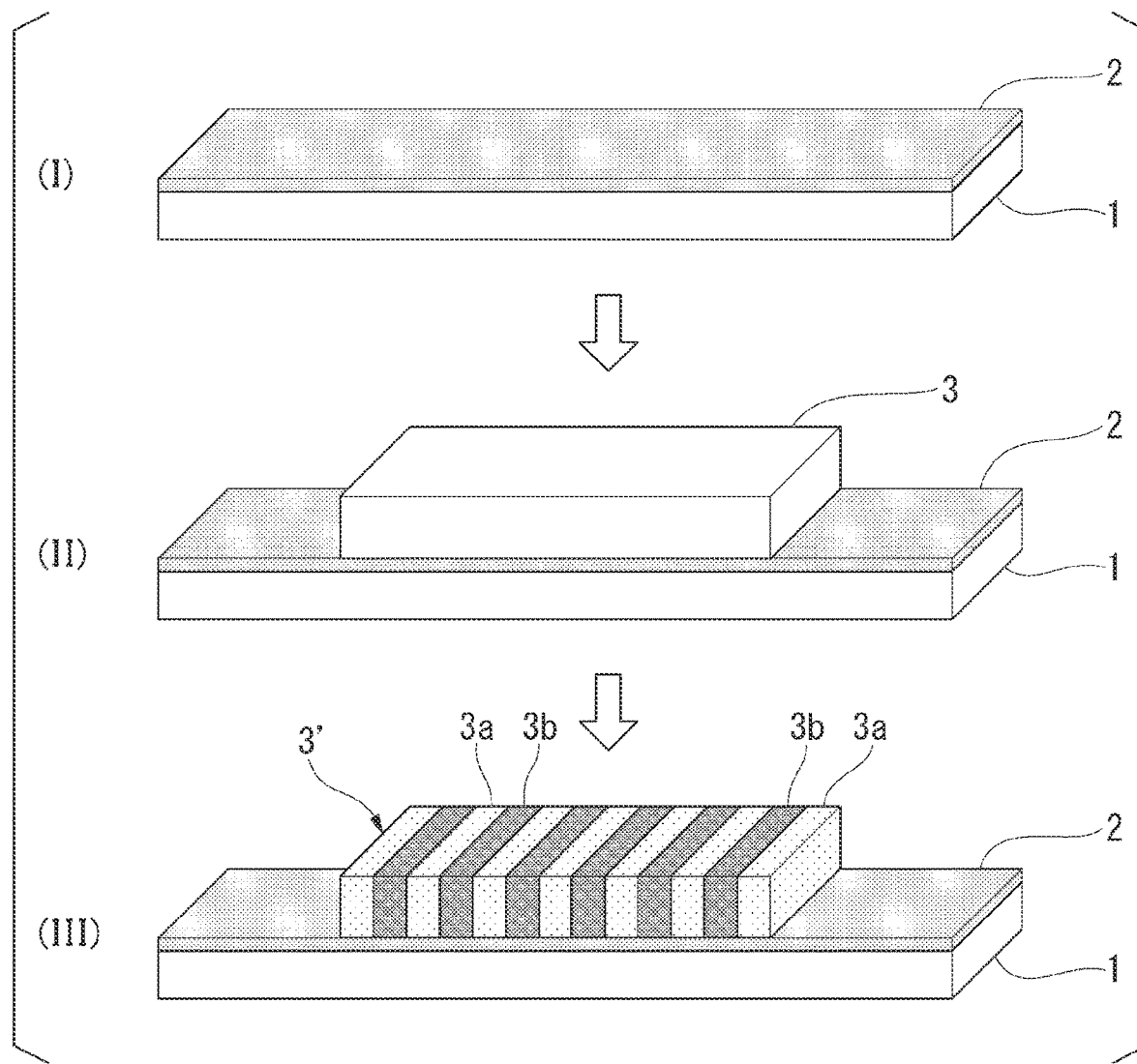
FIG. 1 is a schematic process diagram illustrating an example of an embodiment of a method for producing a structure including a phase-separated structure.

In this specification and claims, the term "aliphatic" is defined as a relative concept to aromatic, and means a group, a compound, and the like having no aromaticity.

Unless otherwise specified, the term "alkyl group" is intended to include linear, branched, and cyclic monovalent saturated hydrocarbon groups. The same applies to the alkyl group in the alkoxy group.

Unless otherwise specified, the term "alkylene group" is intended to include linear, branched, and cyclic divalent saturated hydrocarbon groups.

Examples of the "halogen atom" include a fluorine atom, a chlorine atom, a bromine atom, and an iodine atom.

The term "constituent unit" means a monomer unit for constituting a polymer compound (resin, polymer, and copolymer).

The case where it is described as "may have a substituent" includes both a case where a hydrogen atom (—H) is substituted with a monovalent group and a case where a methylene group (—CH$_2$—) is substituted with a divalent group.

The term "exposure" is a concept including irradiation with radiation as a whole.

"α-position (carbon atom at α-position)" means a carbon atom to which a side chain of a block copolymer is bonded, unless otherwise specified. The "carbon atom at the α-position" of the methyl methacrylate unit means a carbon atom to which a carbonyl group of methacrylic acid is bonded. The "carbon atom at the α-position" of the styrene unit means a carbon atom to which a benzene ring is bonded.

"Number average molecular weight" (Mn) is a number average molecular weight in terms of standard polystyrene measured by size exclusion chromatography, unless otherwise specified.

"Weight average molecular weight" (Mw) is a weight average molecular weight in terms of standard polystyrene measured by size exclusion chromatography, unless otherwise specified. A value obtained by adding a unit (gmol$^{-1}$) to the value of Mn or Mw represents a molar mass.

In the present specification and claims, there may be an asymmetric carbon depending on the structure represented by the chemical formula, and an enantiomer or a diastereomer may exist, and that case, these isomers are represented by one formula. These isomers may be used alone or as a mixed solvent.

Resin Composition for Forming Phase-Separated Structure

The resin composition for forming a phase-separated structure of the present embodiment contains a block copolymer having a block (b1) formed of a repeating structure of styrene units, the block (b1) being partially substituted with a constituent unit represented by the following General Formula (c1) and a block (b2) having a repeating structure of methyl methacrylate units.

Block Copolymer

The block copolymer (hereinafter, also referred to as "(BCP) component") in the present embodiment has a block (b1) formed of a repeating structure of styrene units partially substituted with a constituent unit represented by the following General Formula (c1) and a block (b2) having a repeating structure of methyl methacrylate units.

The (BCP) component may have another block in addition to the block (b1) and the block (b2).

In the (BCP) component, a molar ratio of the styrene unit to the methyl methacrylate unit is preferably from 20:80 to 80:20, and more preferably from 40:60 to 60:40.

The number average molecular weight (Mn) of the (BCP) component (in terms of standard polystyrene measured by size exclusion chromatography) is not particularly limited, and is preferably from 20,000 to 60,000, more preferably from 25,000 to 40,000, and more preferably from 25,000 to 30,000.

The polydispersity (Mw/Mn) of the (BCP) component is preferably from 1.0 to 1.5, more preferably from 1.0 to 1.2, and still more preferably from 1.0 to 1.1.

When the molar ratio of the styrene unit of the (BCP) component to the methyl methacrylate unit and the number average molecular weight (Mn) of the (BCP) component are within the above ranges, a structure having a lamella structure is more likely to be formed.

The period (the length for two molecule of the block copolymer) of the (BCP) component is preferably from 10 to 40 nm, more preferably from 12 to 30 nm, still more preferably from 15 to 25 nm, and particularly preferably from 15 to 21 nm. The period of the (BCP) component can be measured by forming a phase-separated structure using a resin composition for forming a phase-separated structure containing the (BCP) component, and then analyzing the phase-separated structure by an X-ray small angle scattering (SAXS) method.

Block (b1)

The block (b1) has a repeating structure of styrene units, and has a repeating structure of styrene units in which a part of the block (b1) is substituted with a constituent unit represented by the following General Formula (c1).

Hereinafter, the styrene unit is also referred to as a "constituent unit (b11)", and the constituent unit represented by the General Formula (c1) is also referred to as a "constituent unit (b12)".

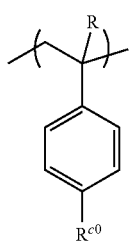

(c1)

[In the formula, R is a hydrogen atom or a methyl group. $R^{c0}$ is a hydrophobic functional group.]

In Formula (c1), $R^{c0}$ is a hydrophobic functional group. The hydrophobic functional group in $R^{c0}$ may be a functional group that increases the hydrophobicity of the monomer that induces the constituent unit (b12) as compared with the hydrophobicity of styrene.

Examples of the hydrophobic functional group include a halogen atom and a hydrocarbon group which may have a substituent. As the halogen atom, a fluorine atom and a chlorine atom are preferable. Examples of the hydrocarbon group include a linear or branched alkyl group and a cyclic hydrocarbon group.

The linear alkyl group preferably has 1 to 30 carbon atoms, more preferably 1 to 25 carbon atoms, and still more preferably 1 to 10 carbon atoms.

Specific examples thereof include a methyl group, an ethyl group, an n-propyl group, an n-butyl group, and an n-pentyl group.

The branched alkyl group preferably has 3 to 30 carbon atoms, more preferably 3 to 25 carbon atoms, and still more preferably 3 to 10 carbon atoms.

Specific examples thereof include an isopropyl group, an isobutyl group, a tert-butyl group, an isopentyl group, a neopentyl group, a 1,1-diethylpropyl group, and a 2,2-dimethylbutyl group.

The cyclic hydrocarbon group may be an aliphatic hydrocarbon group (alicyclic hydrocarbon group) or an aromatic hydrocarbon group, and may be a polycyclic group or a monocyclic group.

As the aliphatic hydrocarbon group which is a monocyclic group, a group obtained by removing one hydrogen atom from monocycloalkane is preferable. The monocycloalkane preferably has 3 to 12 carbon atoms.

As the aliphatic hydrocarbon group which is a polycyclic group, a group obtained by removing one hydrogen atom from polycycloalkane is preferable, and the polycycloalkane preferably has 7 to 12 carbon atoms, and specific examples thereof include adamantane, norbornane, isobornane, tricyclododecane, and tetracyclododecane. Among them, adamantane is preferable as the polycycloalkane.

The aromatic hydrocarbon group is a hydrocarbon group having at least one aromatic ring.

This aromatic ring is not particularly limited as long as it is a cyclic conjugated system having 4n+2 π electrons, and may be monocyclic or polycyclic. The aromatic ring preferably has 5 to 30 carbon atoms, more preferably has 5 to 20 carbon atoms, still more preferably has 6 to 15 carbon atoms, and particularly preferably has 6 to 12 carbon atoms.

Specific examples of the aromatic ring include aromatic hydrocarbon rings such as benzene, naphthalene, anthracene, and phenanthrene; and aromatic heterocyclic rings in which some of the carbon atoms constituting the aromatic hydrocarbon ring are substituted with hetero atoms. Examples of the hetero atom in the aromatic heterocyclic ring include an oxygen atom, a sulfur atom, and a nitrogen atom. Specific examples of the aromatic heterocyclic ring include a pyridine ring and a thiophene ring.

Specific examples of the aromatic hydrocarbon group include a group obtained by removing one hydrogen atom from the aromatic hydrocarbon ring or the aromatic heterocyclic ring (an aryl group or a heteroaryl group); a group obtained by removing one hydrogen atom from an aromatic compound containing two or more aromatic rings (such as biphenyl and fluorene); a group obtained by substituting one of the hydrogen atoms of the aromatic hydrocarbon ring or aromatic heterocyclic ring with an alkylene group (for example, an aryl alkyl group such as a benzyl group, a phenethyl group, a 1-naphthyl methyl group, a 2-naphthyl methyl group, a 1-naphthyl ethyl group, and a 2-naphthyl ethyl group). The alkylene group bonded to the aromatic hydrocarbon ring or the aromatic heterocyclic ring preferably has 1 to 4 carbon atoms, more preferably has 1 to 2 carbon atoms, and particularly preferably has 1 carbon atom.

The hydrocarbon group at $R^{c0}$ may have a substituent. Examples of the substituent include a halogen atom, $-R^{P1'}-R^{P2}-O-R^{P1}$, $-R^{P2}-CO-R^{P1}$, $-R^{P2}-CO-OR^{P1}$, and $-R^{P2}-O-CO-R^{P1}$.

Here, as the halogen atom, a fluorine atom and a chlorine atom are preferable.

$R^{P1}$ is a monovalent chain saturated hydrocarbon group having 1 to 10 carbon atoms, a monovalent aliphatic cyclic saturated hydrocarbon group having 3 to 20 carbon atoms, or a monovalent aromatic hydrocarbon group having 6 to 30 carbon atoms. $R^{P2}$ is a single bond, a divalent chain saturated hydrocarbon group having 1 to 10 carbon atoms, a divalent aliphatic cyclic saturated hydrocarbon group having 3 to 20 carbon atoms, or a divalent aromatic hydrocarbon group having 6 to 30 carbon atoms. Here, some or all of the hydrogen atoms of the chain saturated hydrocarbon group, the aliphatic cyclic saturated hydrocarbon group, and the aromatic hydrocarbon group of $R^{P1}$ and $R^{P2}$ may be substituted with a fluorine atom. The aliphatic cyclic hydrocarbon group may have one or more of the above-mentioned substituents alone, or may have one or more of the above-mentioned substituents.

Examples of the monovalent chain saturated hydrocarbon group having 1 to 10 carbon atoms include a methyl group, an ethyl group, a propyl group, a butyl group, a pentyl group, a hexyl group, a heptyl group, an octyl group and a decyl group.

Examples of the monovalent aliphatic cyclic saturated hydrocarbon group having 3 to 20 carbon atoms include a monocyclic aliphatic saturated hydrocarbon group such as a cyclopropyl group, a cyclobutyl group, a cyclopentyl group, a cyclohexyl group, a cycloheptyl group, a cyclooctyl group, a cyclodecyl group, and a cyclododecyl group; and a polycyclic aliphatic saturated hydrocarbon group such as a bicyclo [2.2.2] octanyl group, a tricyclo [5.2.1.02,6] decanyl group, a tricyclo [3.3.1.13,7] decanyl group, a tetracyclo [6.2.1.13,6.02,7] dodecanyl group, and an adamantyl group.

Examples of the monovalent aromatic hydrocarbon group having 6 to 30 carbon atoms include a group obtained by removing one hydrogen atom from an aromatic hydrocarbon ring such as benzene, biphenyl, fluorene, naphthalene, anthracene, and phenanthrene.

Among them, the substituent in the hydrocarbon group is preferably a halogen atom or an $-R^{P1}$, more preferably $-R^{P1}$, more preferably a monovalent chain saturated hydrocarbon group having 1 to 10 carbon atoms, and a methyl group and an ethyl group are particularly preferable.

In Formula (c1), $R^{c0}$ is preferably a cyclic hydrocarbon group which may have a substituent, more preferably a polycyclic alicyclic hydrocarbon group which may have a substituent, and still more preferably a polycyclic alicyclic hydrocarbon group having a substituent.

A suitable specific example for $R^{c0}$ in Formula (c1) is described below. * represents a bond bonded to the carbon atom of the phenylene group in Formula (c1).

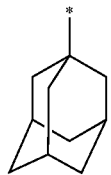

(R$^{c0}$-1-1)

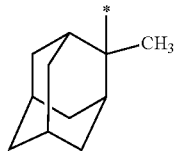

(R$^{c0}$-1-2)

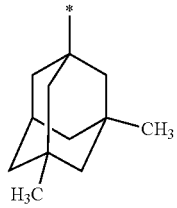

(R$^{c0}$-1-3)

$R^{c0}$ in Formula (c1) is preferably a group represented by Formula (R$^{c0}$-1-3) among the above.

The proportion of the constituent unit (b12) in the (BCP) component is preferably 1 to 25 mol %, more preferably 3 to 20 mol %, and still more preferably 5 to 10 mol % with respect to all the constituent units (100 mol %) constituting the (BCP) component.

When the proportion of the constituent unit (b12) is equal to or higher than the lower limit of the above-mentioned preferable range, the phase separation performance can be further enhanced. On the other hand, when it is equal to or lower than the upper limit of the above-mentioned preferable range, the volume fraction of the block (b1) does not become too high, and the phase-separated structure assumed from the proportion of the hydrophilic block (b2) and the hydrophobic block (b1) described later is likely to be stably formed.

The proportion of the constituent unit (b12) in the (BCP) component is particularly preferable when the number average molecular weight (Mn) (polystyrene conversion standard by size exclusion chromatography) of each block constituting the (BCP) component is from 25,000 to 40,000.

The proportion of the constituent unit (b12) in the block (b1) is preferably 2 mol % or more, more preferably from 6 to 40 mol %, and still more preferably from 10 to 20 mol % with respect to all the constituent units (100 mol %) constituting the block (b1).

When the proportion of the constituent unit (b12) is equal to or higher than the lower limit of the above-mentioned preferable range, the phase separation performance can be further enhanced. On the other hand, when it is equal to or lower than the upper limit value of the above-mentioned preferable range, the hydrophobicity of the block (b1) is suppressed to an appropriate height.

The proportion of the constituent unit (b12) in the block (b1) can be controlled by the charging amount of the block copolymer in the step (p2) described later, the charging amount of the compound having a hydrophobic functional group ($R^{c0}$), the reaction time, and the like.

The number average molecular weight (Mn) of block (b1) constituting the (BCP) component (in terms of standard polystyrene measured by size exclusion chromatography) is not particularly limited, and is preferably from 10,000 to 30,000, more preferably from 12,500 to 20,000, and still more preferably from 12,500 to 15,000.

Block (b2)

The block (b2) consists of a block having a repeating structure of methyl methacrylate units.

The block (b2) may have a repeating structure of methyl methacrylate, or may have a repeating structure of methyl methacrylate units, in which the block (b2) is partially substituted with a constituent unit represented by the following General Formula (h1).

Hereinafter, the methyl methacrylate unit is also referred to as a "constituent unit (b21)", and the constituent unit represented by the General Formula (h1) is also referred to as a "constituent unit (b22)".

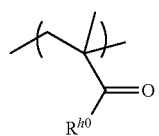

(h1)

[In the formula, $R^{h0}$ is a hydrophilic functional group.]

In Formula (h1), $R^{h0}$ is a hydrophilic functional group.

The hydrophilic functional group in $R^{h0}$ may be a functional group that increases the hydrophilicity of the monomer that induces the constituent unit (b22) as compared with the hydrophilicity of methyl methacrylate, and in particular, the hydrophilic functional group derived from amine is preferable.

Examples of the hydrophilic functional group derived from amine in $R^{h0}$ include a functional group represented by the following General Formula ($R^{h0}$-1).

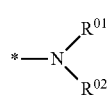

($R^{h0}$-1)

[In the formula, $R^{01}$ is an aliphatic hydrocarbon group having at least —OH as a substituent. $R^{02}$ is an aliphatic hydrocarbon group or a hydrogen atom which may have a substituent. * represents a bond bonded to the carbon atom of the carbonyl group in Formula (h1).]

In the above Formula (Rho-1), $R^{01}$ is an aliphatic hydrocarbon group having at least —OH as a substituent.

The aliphatic hydrocarbon group in $R^{01}$ may be chain or cyclic, and is preferably chain. In addition, the aliphatic hydrocarbon group in $R^{01}$ may be linear or branched, but is preferably linear.

As the aliphatic hydrocarbon group (in a state having no substituent) in $R^{01}$, an alkyl group having 1 to 8 carbon atoms is preferable, an alkyl group having 1 to 5 carbon atoms is more preferable, and an alkyl group having 1 to 3 carbon atoms is still more preferable.

Examples of the substituent that is substituted with the hydrogen atom bonded to the aliphatic hydrocarbon group in $R^{01}$ include a hydroxy group and an alkoxy group.

In the above Formula ($R^{h0-1}$), $R^{02}$ is an aliphatic hydrocarbon group or a hydrogen atom which may have a substituent.

Examples of the aliphatic hydrocarbon group in $R^{02}$ include those similar to the aliphatic hydrocarbon group in $R^{01}$ (in a state having no substituent).

Examples of the substituent that is substituted with the hydrogen atom bonded to the aliphatic hydrocarbon group in $R^{02}$ include a hydroxy group and an alkoxy group.

Specific examples of $R^{h0}$ (hydrophilic functional group) are described below.

($R^{h0}$-1-1)

The proportion of the constituent unit (b22) in the (BCP) component is preferably 0.5 to 5 mol %, more preferably 0.5 to 2.5 mol %, and still more preferably 0.5 to 1.5 mol % with respect to all the constituent units (100 mol %) constituting the (BCP) component.

When the proportion of the constituent unit (b22) is equal to or higher than the lower limit of the above-mentioned preferable range, the phase separation performance can be further enhanced. On the other hand, when it is equal to or lower than the upper limit of the above-mentioned preferable range, the hydrophilicity of the block (b2) does not become too high, and the phase-separated structure of the hydrophobic block (b1) and the hydrophilic block (b2) is likely to be stably formed.

The proportion of the constituent unit (b22) in the block (b2) is preferably 1 mol % or more, more preferably from 1 to 5 mol %, and still more preferably from 1 to 3 mol % with respect to all the constituent units (100 mol %) constituting the block (b2).

When the proportion of the constituent unit (b22) is equal to or higher than the lower limit of the above-mentioned preferable range, the phase separation performance can be further enhanced. On the other hand, when it is equal to or lower than the upper limit value of the above-mentioned preferable range, the hydrophilicity of the block (b2) is suppressed to an appropriate height.

The proportion of the constituent unit (b22) in the block (b2) can be controlled by the reaction time of the block copolymer in the step (p3) or the like described later and the compound having a hydrophilic functional group ($R^{h0}$), and the charging amount of each component.

The number average molecular weight (Mn) of block (b2) constituting the (BCP) component (in terms of standard polystyrene measured by size exclusion chromatography) is not particularly limited, and is preferably from 10,000 to 30,000, more preferably from 12,500 to 20,000, and still more preferably from 12,500 to 15,000.

The (BCP) component in the present embodiment may have a structure (e1) represented by the following General Formula (e1) at the main chain terminal. In a case where the (BCP) component has the structure (e1), the structure (e1) is bonded to the main chain terminal of the block (b2) disposed at a terminal portion of the block copolymer.

(e1)

[In the formula, $R^{e0}$ represents a hydrocarbon group containing a hetero atom, and $R^{e1}$ represents a hydrogen atom or a halogen atom. * represents a bond bonded to the carbon atom at an α-position of an adjacent methyl methacrylate unit.]

Structure (e1)

The (BCP) component may have a structure (e1) represented by General Formula (e1) at least at one main chain terminal. The structure (e1) is bonded to the main chain terminal of the terminal block (b2). In a case where the (BCP) component has the terminal block (b2) at both terminal portions, the structure (e1) may be bonded to the main chain terminal of both terminal blocks (b2), or may be bonded to the main chain terminal of one terminal block (b2). Here, the "main chain" of the block (b2) means a carbon chain formed by polymerization of a methacrylic acid monomer in the block (b2). It can be said that the "main chain" of the block (b2) is the longest carbon chain among the carbon chains constituting the block (b2).

In General Formula (e1), $R^{e1}$ represents a hydrogen atom or a halogen atom.

Examples of the halogen atom in $R^{e1}$ include a fluorine atom, a chlorine atom, a bromine atom, and an iodine atom. Among them, a chlorine atom is preferable.

In General Formula (e1), * represents a bond bonded to the carbon atom at an α-position of an adjacent methyl methacrylate unit.

In General Formula (e1), $R^{e0}$ is a hydrocarbon group containing a hetero atom.

The hydrocarbon group in $R^{e0}$ may be an aliphatic hydrocarbon group containing a hetero atom or an aromatic hydrocarbon group containing a hetero atom.

Aliphatic Hydrocarbon Group Containing Hetero Atoms

The aliphatic hydrocarbon group in the aliphatic hydrocarbon groups containing a hetero atom may be a saturated aliphatic hydrocarbon group or an unsaturated aliphatic hydrocarbon group. More specifically, examples of the aliphatic hydrocarbon group include a linear or branched aliphatic hydrocarbon group and an aliphatic hydrocarbon group having a ring in the structure.

The linear aliphatic hydrocarbon group preferably has 1 to 30 carbon atoms, more preferably has 3 to 20 carbon atoms, and still more preferably has 4 to 15 carbon atoms. The branched aliphatic hydrocarbon group preferably has 3 to 30 carbon atoms, more preferably has 3 to 20 carbon atoms, and still more preferably has 4 to 15 carbon atoms.

Specific examples of the linear or branched aliphatic hydrocarbon group include linear alkyl groups such as a methyl group, an ethyl group, an n-propyl group, an n-butyl group, an n-pentyl group, an n-hexyl group, an n-heptyl group, an n-octyl group, an n-nonyl group, and an n-decyl group; branched alkyl groups such as an isopropyl group, an isobutyl group, a tert-butyl group, an isopentyl group, a neopentyl group, a 1,1-diethyl propyl group, and a 2,2-dimethyl butyl group; linear alkenyl groups such as a vinyl group, a propenyl group (allyl group), and a 2-butenyl group; branched alkenyl groups such as a 1-methyl vinyl group, a 2-methyl vinyl group, a 1-methyl propenyl group, and 2-methyl propenyl group; linear alkynyl groups such as an ethynyl group, a propargyl group, and a 3-pentynyl group; and a branched alkynyl groups such as 1-methyl propargyl group.

The linear or branched aliphatic hydrocarbon group in $R^{e0}$ contains a hetero atom. Examples of the hetero atom include an oxygen atom, a nitrogen atom, a sulfur atom, and a halogen atom.

The hetero atom contained in the linear or branched aliphatic hydrocarbon group in $R^{e0}$ may be included in a substituent that is substituted with a hydrogen atom of the linear or branched aliphatic hydrocarbon group. Examples of the substituent include a hydroxy group, a hydroxyalkyl group (such as a hydroxymethyl group), a carboxy group, an alkoxy group, a halogen atom, an azido group, an amino group, an alkylamino group (such as a methylamino group), and a dialkylamino group (dimethylamino group). As the substituent, a hydroxy group, a halogen atom, or an azido group is preferable. Examples of the halogen atom include a fluorine atom, a chlorine atom, a bromine atom, and an iodine atom, and a fluorine atom or a chlorine atom is preferable, and a fluorine atom is more preferable. The alkyl group in the substituent preferably has 1 to 5 carbon atoms, more preferably has 1 to 3 carbon atoms, and still more preferably has 1 or 2 carbon atoms.

The hetero atom contained in the linear or branched aliphatic hydrocarbon group in $R^{e0}$ may be substituted with a part of the methylene group constituting the aliphatic hydrocarbon chain. Examples of the hetero atom include an oxygen atom, a nitrogen atom, and a sulfur atom. Among them, as the hetero atom, an oxygen atom or a nitrogen atom is preferable, and an oxygen atom is more preferable.

As a specific example of a linear or branched aliphatic hydrocarbon group with which a part of a methylene group is substituted, a part of a methylene group (—CH$_2$—) is substituted with an oxygen atom (—O—). Examples of such an aliphatic hydrocarbon group include a group having an oxyalkylene structure (—(CH$_2$)$_t$O—) (t is an integer of 1 to 5), and an oxyethylene structure (—CH$_2$CH$_2$O—) is preferable. Specific examples of such $R^{e0}$ include —(CH$_2$CH$_2$O)$_k$—CH$_3$. k in the above formula is an integer of 1 or more, preferably 4 or more, more preferably 20 or more, still more preferably 40 or more, and particularly preferably 80 or more. The upper limit of k is not particularly limited, and is, for example, 300 or less, 200 or less, 150 or less. The range of k is preferably 4 to 300, more preferably 30 to 200, and still more preferably 40 to 150.

Examples of the aliphatic hydrocarbon group having a ring in the structure of $R^{e0}$ include an alicyclic hydrocarbon group (a group obtained by removing one hydrogen atom from an aliphatic hydrocarbon ring) and a group obtained by substituting one hydrogen atom of an aliphatic hydrocarbon ring with an alkylene group. The alkylene group preferably has 1 to 10 carbon atoms. The aliphatic hydrocarbon ring preferably has 3 to 10 carbon atoms, and more preferably 3 to 6 carbon atoms.

The aliphatic hydrocarbon ring may be polycyclic or monocyclic.

The monocyclic aliphatic hydrocarbon ring preferably has 3 to 6 carbon atoms, and specific examples thereof include cyclopropane, cyclobutane, cyclopentane, and cyclohexane.

The polycyclic aliphatic hydrocarbon ring preferably has 7 to 10 carbon atoms, and specific examples thereof include polycycloalkanes having a cross-linked polycyclic skeleton such as adamantane, norbornane, and isobornane.

The cyclic aliphatic hydrocarbon group in $R^{e0}$ contains a hetero atom. Examples of the hetero atom include an oxygen atom, a nitrogen atom, a sulfur atom, and a halogen atom.

The hetero atom contained in the cyclic aliphatic hydrocarbon group in $R^{e0}$ may be substituted with a part of the carbon atoms constituting a ring, and $R^{e0}$ may be an aliphatic heterocyclic ring. Examples of the hetero atom include an oxygen atom, a sulfur atom, and a nitrogen atom. Specific examples of the aliphatic heterocyclic ring include pyrrolidine, piperidine, ethylene oxide, tetrahydrofuran, tetrahydropyran, tetrahydrothiophene, and tetrahydrothiopyran.

In a case where the cyclic aliphatic hydrocarbon group in $R^{e0}$ contains an aliphatic heterocyclic ring, the aliphatic heterocyclic ring may have a substituent. Examples of the substituent include a hydroxy group, a hydroxyalkyl group (such as a hydroxymethyl group), a carboxy group, an alkoxy group, a halogen atom, an azido group, an amino group, an alkylamino group (such as a methylamino group), a dialkylamino group (dimethylamino group), an alkyl group, an alkenyl group, and an alkynyl group. In the above substituents, a hydroxyalkyl group, an alkoxy group, an alkylamino group, an alkyl group in a dialkylamino group, an alkyl group, an alkenyl group, and an alkynyl group preferably have 1 to 5 carbon atoms, more preferably has 1 to 3 carbon atoms, and still more preferably has 1 or 2 carbon atoms.

The hetero atom included in the cyclic aliphatic hydrocarbon group in $R^{e0}$ may be included in a substituent that is substituted with a hydrogen atom of the linear or cyclic aliphatic hydrocarbon group. Examples of the substituent include a hydroxy group, a hydroxyalkyl group (such as a hydroxymethyl group), a carboxy group, an alkoxy group, a halogen atom, an azido group, an amino group, an alkylamino group (such as a methylamino group), and a dialkylamino group (dimethylamino group). In the above substituents, a hydroxyalkyl group, an alkoxy group, an alkylamino group, and an alkyl group in a dialkylamino group preferably have 1 to 5 carbon atoms, more preferably has 1 to 3 carbon atoms, and still more preferably has 1 or 2 carbon atoms.

The cyclic aliphatic hydrocarbon group in $R^{e0}$ may have a substituent such as an alkyl group, an alkenyl group, or an alkynyl group in addition to the above-described substituent containing a hetero atom. An alkyl group, an alkenyl group, and an alkynyl group in the substituent preferably have 1 to 5 carbon atoms, more preferably have 1 to 3 carbon atoms, and more preferably have 1 or 2 carbon atoms.

Among them, the aliphatic hydrocarbon group containing a hetero atom in $R^{e0}$ is preferably a linear or branched aliphatic hydrocarbon group containing a hetero atom, and a linear aliphatic hydrocarbon group containing a hetero atom is more preferable.

Aromatic Hydrocarbon Group Containing Hetero Atoms

In a case where the hydrocarbon group containing a hetero atom in $R^{e0}$ becomes an aromatic hydrocarbon group containing a hetero atom, the aromatic hydrocarbon group is a hydrocarbon group having at least one aromatic ring. This aromatic ring is not particularly limited as long as it is a cyclic conjugated system having $4n+2$ $\pi$ electrons, and may be monocyclic or polycyclic. The number of carbon atoms in the aromatic ring is preferably from 5 to 20, more preferably from 5 to 18, and still more preferably from 6 to 16.

Specific examples of the aromatic ring include aromatic hydrocarbon rings such as benzene, naphthalene, anthracene, phenanthrene, and pyrene; and aromatic heterocyclic rings in which some of the carbon atoms constituting the aromatic hydrocarbon ring are substituted with hetero atoms. Examples of the hetero atom in the aromatic heterocyclic ring include an oxygen atom, a sulfur atom, and a nitrogen atom. Specific examples of the aromatic heterocyclic ring include a pyrrolidine ring, a pyridine ring, a thiophene ring, an imidazole ring, a triazole ring, and a tetrazole ring.

Specific examples of the aromatic hydrocarbon group in $R^{e0}$ include a group obtained by removing one hydrogen atom from the aromatic hydrocarbon ring or the aromatic heterocyclic ring (an aryl group or a heteroaryl group); a group obtained by removing one hydrogen atom from an aromatic compound containing two or more aromatic rings (such as biphenyl and fluorene); a group obtained by substituting one of the hydrogen atoms of the aromatic hydrocarbon ring or aromatic heterocyclic ring with an alkylene group (for example, an aryl alkyl group such as a benzyl group, a phenethyl group, a 1-naphthyl methyl group, a 2-naphthyl methyl group, a 1-naphthyl ethyl group, and a 2-naphthyl ethyl group). The alkylene group bonded to the aromatic hydrocarbon ring or the aromatic heterocyclic ring preferably has 1 to 15 carbon atoms, and more preferably has 2 to 10 carbon atoms.

The aromatic hydrocarbon group in $R^{e0}$ contains a hetero atom. Examples of the hetero atom include an oxygen atom, a nitrogen atom, a sulfur atom, and a halogen atom.

The hetero atom contained in the aromatic hydrocarbon group in $R^{e0}$ may be one with which a part of the carbon atoms constituting the aromatic hydrocarbon ring is substituted, and $R^{e0}$ may be a group containing an aromatic heterocyclic ring. Examples of the aromatic heterocyclic ring include those exemplified above.

In a case where $R^{e0}$ contains an aromatic heterocyclic ring, the aromatic heterocyclic ring may have a substituent. Examples of the substituent include a hydroxy group, a hydroxyalkyl group (such as a hydroxymethyl group), a carboxy group, an alkoxy group, a halogen atom, an azido group, an amino group, an alkylamino group (such as a methylamino group), a dialkylamino group (dimethylamino group), an alkyl group, an alkenyl group, and an alkynyl group. In the above substituents, a hydroxyalkyl group, an alkoxy group, an alkylamino group, an alkyl group in a dialkylamino group, an alkyl group, an alkenyl group, and an alkynyl group preferably have 1 to 5 carbon atoms, more preferably has 1 to 3 carbon atoms, and still more preferably has 1 or 2 carbon atoms.

The hetero atom included in the aromatic hydrocarbon group in $R^{e0}$ may be included in a substituent that is substituted with a hydrogen atom of the aromatic hydrocarbon group. Examples of the substituent include a hydroxy group, a carboxy group, an alkoxy group, a halogen atom, an azido group, a hydroxyalkyl group (such as a hydroxymethyl group), an amino group, an alkylamino group (such as a methylamino group), and a dialkylamino group (dimethylamino group). In the above substituents, a hydroxyalkyl group, an alkylamino group, an alkoxy group, and an alkyl group in a dialkylamino group preferably have 1 to 5 carbon atoms, more preferably has 1 to 3 carbon atoms, and still more preferably has 1 or 2 carbon atoms.

The aromatic hydrocarbon group in $R^{e0}$ may have a substituent such as an alkyl group, an alkenyl group, or an alkynyl group in addition to the above-described substituent containing a hetero atom. An alkyl group, an alkenyl group, and an alkynyl group in the substituent preferably have 1 to 5 carbon atoms, more preferably have 1 to 3 carbon atoms, and more preferably have 1 or 2 carbon atoms.

Among them, as the aromatic hydrocarbon group containing a hetero atom in $R^{e0}$, a group containing an aromatic heterocyclic ring is preferable, and a group obtained by substituting one of the hydrogen atoms of the aromatic heterocyclic ring with an alkylene group is more preferable.

Preferable examples of $R^{e0}$ include a linear or branched aliphatic hydrocarbon group having a substituent containing a hetero atom; a linear or branched aliphatic hydrocarbon group obtained by substituting a part of a methylene group constituting an aliphatic hydrocarbon chain with a hetero atom; an aliphatic hydrocarbon group having a ring in the structure, having a substituent containing a hetero atom; an aliphatic hydrocarbon group containing an aliphatic heterocyclic ring; an aromatic hydrocarbon group having a substituent containing a hetero atom; and a hydrocarbon group containing an aromatic heterocyclic ring. Among them, from the aspect that χ is likely to be high and the phase separation performance is further improved, a linear or branched aliphatic hydrocarbon group having a substituent containing a hetero atom and a linear or branched aliphatic hydrocarbon group obtained by substituting a part of a methylene group constituting an aliphatic hydrocarbon chain with a hetero atom; and a hydrocarbon group containing an aromatic heterocyclic ring are preferable.

More specifically, a linear or branched aliphatic hydrocarbon group obtained by substituting a part of hydrogen atoms with a halogen atom (preferably fluorine atom); an aliphatic hydrocarbon group obtained by substituting a part of hydrogen atoms with an amino group, an alkylamino group, or a dialkylamino group; a linear or branched aliphatic hydrocarbon group obtained by substituting a part of hydrogen atoms with an azido group; a group obtained by removing one hydrogen atom from an aromatic heterocyclic ring containing a nitrogen atom; a group obtained by substituting one of the hydrogen atoms of an aromatic heterocyclic ring containing a nitrogen atom with an alkylene group; and a group having an oxyalkylene structure (—(CH$_2$)$_t$O—) (t is an integer of 1 to 5) (preferably a group having an oxyethylene structure (—CH$_2$CH$_2$O—)). The aliphatic hydrocarbon group in the groups exemplified above is preferably a linear aliphatic hydrocarbon group.

Specific examples of $R^{e0}$ are described below. In the following formula, * represents a bond bonded to the oxygen atom in General Formula (e1). k is an integer of 1 or more, preferably 4 or more, and more preferably 10 or more.

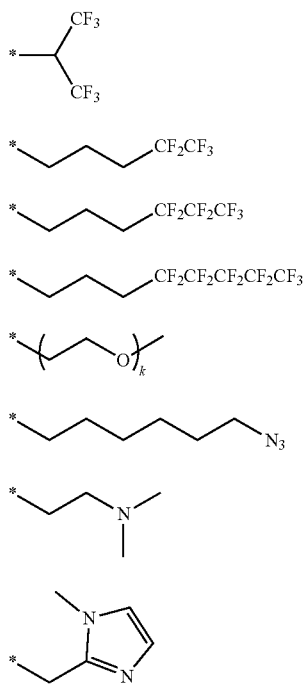

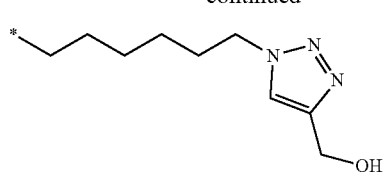

Among the above, $R^{e0}$ is preferably a group represented by any of Formulae (Re0-2), (Re0-5), (Re0-6), and (Re0-9).

Preferable examples of the structure (e1) include a structure represented by General Formula (e1-1).

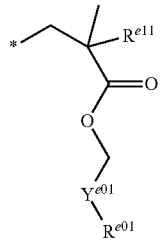

[In the formula, $R^{e01}$ represents a hydrocarbon group containing a hetero atom, $R^{e11}$ represents a hydrogen atom or a halogen atom, and $Y^{e01}$ represents an alkylene group which may have a substituent. * represents a bond bonded to the carbon atom at an α-position of an adjacent methyl methacrylate unit.]

In General Formula (e1-1), $R^{e11}$ represents a hydrogen atom or a halogen atom. Examples of the halogen atom in $R^{e11}$ include a fluorine atom, a chlorine atom, a bromine atom, and an iodine atom. Among them, a chlorine atom is preferable.

In General Formula (e1-1), * represents a bond bonded to the carbon atom at an α-position of an adjacent methyl methacrylate unit.

In General Formula (e1-1), $Y^{e01}$ represents an alkylene group which may have a substituent.

The alkylene group in $Y^{e01}$ may be linear or branched, but is preferably linear. The alkylene group in $Y^{e01}$ preferably has 1 to 20 carbon atoms, more preferably has 1 to 15 carbon atoms, still more preferably has 1 to 10 carbon atoms, and particularly preferably has 1 to 6 carbon atoms.

The alkylene group in $Y^{e01}$ may have a substituent. Examples of the substituent include a hydroxy group, a hydroxyalkyl group (such as a hydroxymethyl group), a carbonyl group, an alkoxy group, a halogen atom, an azido group, an amino group, an alkylamino group (such as a methylamino group), and a dialkylamino group (dimethylamino group) and the like.

$Y^{e01}$ preferably an alkylene group having no substituent.

In General Formula (e1-1), $R^{e01}$ represents a hydrocarbon group containing a hetero atom.

Examples of the hydrocarbon group containing a hetero atom in $R^{e01}$ are the same as those exemplified as the hydrocarbon group in $R^{e0}$ in General Formula (e1). Examples of the hydrocarbon group containing a hetero atom include a linear or branched aliphatic hydrocarbon group having a substituent containing a hetero atom; a linear or branched aliphatic hydrocarbon group obtained by substituting a part of a methylene group constituting an aliphatic hydrocarbon chain with a hetero atom; an aliphatic hydrocarbon group having a ring in the structure, having a substituent containing a hetero atom; an aliphatic hydrocarbon group containing an aliphatic heterocyclic ring; an aromatic hydrocarbon group having a substituent containing a hetero atom; and a hydrocarbon group containing an aromatic heterocyclic ring. Among them, from the aspect that χ is likely to be high and the phase separation performance is further improved, a linear or branched aliphatic hydrocarbon group having a substituent containing a hetero atom and a linear or branched aliphatic hydrocarbon group obtained by substituting a part of a methylene group constituting an aliphatic hydrocarbon chain with a hetero atom; and a hydrocarbon group containing an aromatic heterocyclic ring are preferable.

More specifically, a linear or branched aliphatic hydrocarbon group obtained by substituting a part of hydrogen atoms with a halogen atom (preferably fluorine atom); an aliphatic hydrocarbon group obtained by substituting a part of hydrogen atoms with an amino group, an alkylamino group, or a dialkylamino group; a linear or branched aliphatic hydrocarbon group obtained by substituting a part of hydrogen atoms with an azido group; a group obtained by removing one hydrogen atom from an aromatic heterocyclic ring containing a nitrogen atom; and a group having an oxyalkylene structure (—(CH$_2$)$_t$O—) (t is an integer of 1 to 5) (preferably a group having an oxyethylene structure (—CH$_2$CH$_2$O—)). The aliphatic hydrocarbon group in the groups exemplified above is preferably a linear aliphatic hydrocarbon group.

Specific examples of R$^{e01}$ are described below. In the following formula, * represents a bond bonded to Y$^{e01}$. k1 represents an integer of 0 or more. k1 is preferably an integer of 1 to 10, more preferably an integer of 1 to 5, and still more preferably an integer of 1 to 4. k2 represents an integer of 1 or more, and preferably an integer of 4 or more.

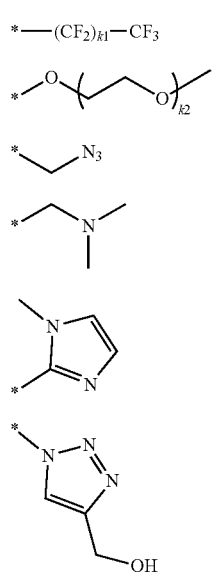

Specific examples of the structure (e1) are described below, but the structure is not limited thereto. In the formula, * represents a bond bonded to the carbon atom at an α-position of an adjacent methyl methacrylate unit. k is an integer of 1 or more, preferably 4 or more, and more preferably 10 or more.

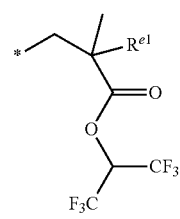
(e1-1)

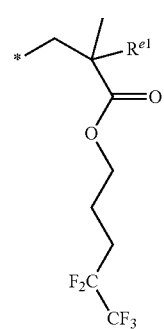
(e1-2)

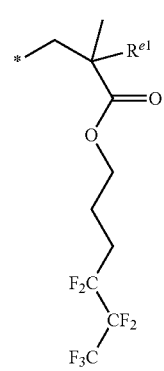
(e1-3)

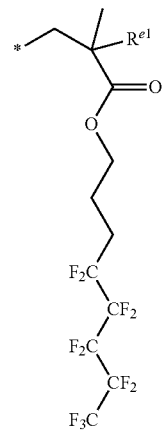
(e1-4)

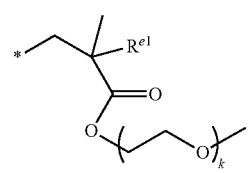
(e1-5)

-continued (e1-6)
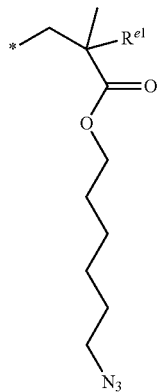

(e1-7)
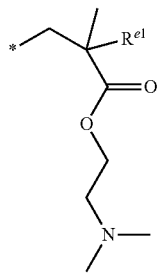

(e1-8)
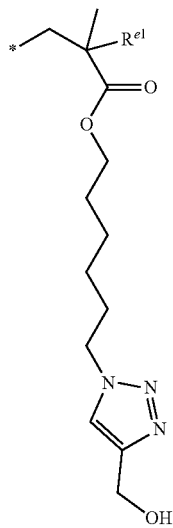

(e1-9)
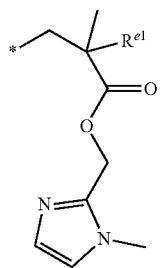

Among the above, the structure (e1) is preferably a structure represented by any one of the formulas (e1-2), (e1-5), (e1-6), and (e1-8).

The structure of the terminal block (b2) in which the structure (e1) is bonded to the main chain terminal can be represented by General Formula (b2e-1). The (BCP) component has one or two structures represented by General Formula (b2e-1), and preferably has one.

(b2e-1)
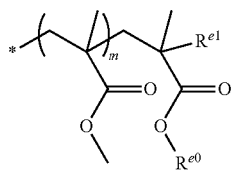

[In the formula, $R^{e0}$ and $R^{e1}$ are the same as $R^{e0}$ and $R^{e1}$ in General Formula (e1), respectively. m is an integer of 1 or more. * represents a bond bonded to the carbon atom at an α-position of an adjacent constituent unit.]

In General Formula (b2e-1), $R^{e0}$ and $R^{e1}$ are the same as $R^{e0}$ and $R^{e1}$ in General Formula (e1) respectively, and preferable examples include the same ones respectively.

In General Formula (b2e-1), m is an integer of 1 or more. The upper limit of m is not particularly limited. m can be, for example, 40 to 480.

In a case where the structure (e1) is a structure represented by General Formula (e1-1), the structure of the terminal block (b2) in which the structure (e1) is bonded to the main chain terminal is represented by General Formula (b2e-1-1).

(b2e-1-1)
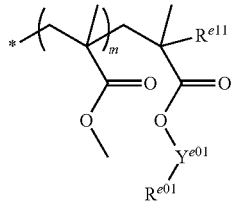

[In the formula, $R^{e01}$, $R^{e11}$, and $Y^{e01}$ are the same as $R^{e01}$, $R^{e11}$, and $Y^{e01}$ in General Formula (e1-1), respectively. m represents an integer of 1 or more. represents a bond bonded to the carbon atom at an α-position of an adjacent constituent unit.]

In General Formula (b2e-1-1), $R^{e01}$, $R^{e11}$, and $Y^{e01}$ are the same as $R^{e01}$, $R^{e11}$, and $Y^{e01}$ in General Formula (e1-1) respectively, and preferable examples include the same ones respectively. In General Formula (b2e-1-1), m is an integer of 1 or more, and is the same as m in General Formula (b2e-1).

Organic Solvent Component

The resin composition for forming a phase-separated structure of the embodiment can be prepared by dissolving the (BCP) component in an organic solvent component.

Any organic solvent component may be used as long as it can dissolve the respective components to be used and form a homogeneous solution, and arbitrary solvents may be selected from any solvents known in the related art as a solvent for a film composition including a resin as a main component.

Examples of the organic solvent component include lactones such as γ-butyrolactone; ketones such as acetone, methyl ethyl ketone, cyclohexanone, methyl-n-pentyl ketone, methyl isopentyl ketone, and 2-heptanone; polyhydric alcohols such as ethylene glycol, diethylene glycol, propylene glycol, and dipropylene glycol; a compound having an ester bond such as ethylene glycol monoacetate, diethylene glycol monoacetate, propylene glycol monoacetate, and dipropylene glycol monoacetate; derivatives of polyhydric alcohols such as compounds having an ether bond such as monoalkyl ethers such as monomethyl ether, monoethyl ether, monopropyl ether, and monobutyl ether or monophenyl ether of the polyhydric alcohols or compounds having an ester bond [among these, propylene glycol monomethyl ether acetate (PGMEA) and propylene glycol monomethyl ether (PGME) are preferable]; cyclic ethers such as dioxane, or esters such as methyl lactate, ethyl lactate (EL), methyl acetate, ethyl acetate, butyl acetate, methyl pyruvate, ethyl pyruvate, methyl methoxy propionate, and ethyl ethoxy propionate; aromatic organic solvents such as anisole, ethyl benzyl ether, cresyl methyl ether, diphenyl ether, dibenzyl ether, phenetole, butyl phenyl ether, ethyl benzene, diethyl benzene, pentyl benzene, isopropyl benzene, toluene, xylene, cymene, and mesitylene.

The organic solvent components may be used alone or as a mixed solvent of two or more kinds thereof. Among these, propylene glycol monomethyl ether acetate (PGMEA), propylene glycol monomethyl ether (PGME), cyclohexanone, and EL are preferable, and propylene glycol monomethyl ether acetate (PGMEA) is more preferable.

A mixed solvent which is obtained by mixing PGMEA and a polar solvent is also preferable. The blending ratio (mass ratio) may be appropriately determined in consideration of compatibility between PGMEA and the polar solvent, and it is preferably in a range of 1:9 to 9:1 and more preferably 2:8 to 8:2.

For example, in a case where EL is blended as a polar solvent, the mass ratio of PGMEA:EL is preferably 1:9 to 9:1 and more preferably 2:8 to 8:2. In a case where PGME is blended as the polar solvent, the mass ratio of PGMEA:PGME is preferably 1:9 to 9:1, more preferably 2:8 to 8:2, and still more preferably 3:7 to 7:3. In a case where PGME and cyclohexanone are blended as a polar solvent, the mass ratio of PGMEA:(PGME+cyclohexanone) is preferably 1:9 to 9:1, more preferably 2:8 to 8:2, and still more preferably 3:7 to 7:3.

As the organic solvent component in the resin composition for forming a phase-separated structure, in addition to those components, a mixed solvent in which PGMEA, EL, or the mixed solvent of PGMEA and a polar solvent is mixed with γ-butyrolactone is also preferable. In this case, the mass ratio of the former to the latter is, as the mixing ratio, preferably 70:30 to 95:5.

The concentration of the organic solvent component included in the resin composition for forming a phase-separated structure is not particularly limited, and the component is appropriately set at a concentration with which the coating can be performed according to the coating film thickness. The solid content concentration is generally used in a range of 0.2 to 70 mass % and preferably in a range of 0.2 to 50 mass %.

Optional Component

The resin composition for forming a phase-separated structure may appropriately include, if desired, miscible additives such as additional resins for improving the layer performance, surfactants for improving coatability, a dissolution inhibitor, a plasticizer, a stabilizer, a colorant, a halation inhibitor, a dye, a sensitizer, a base proliferating agent, and a basic compound, in addition to the above-mentioned (BCP) component and the organic solvent component.

The resin composition for forming a phase-separated structure of the present embodiment described above has a block (b1) and a block (b2). Since the block copolymer has the block (b1) and the block (b2), the pro-hydrophobic difference between the hydrophobic block portion (block (b1)) and the hydrophilic block portion (block (b2)) in the phase-separated structure is larger than a pro-hydrophobic difference between the styrene unit block and the methyl methacrylate unit block. As a result, the repulsion between the block (b1) and the block (b2) is increased, that is, the value of the interaction parameter ($\chi$) is increased, so that the phase separation performance is further enhanced.

In addition, the (BCP) component in the embodiment can achieve hydrophobicization by using a block copolymer (PS-b-PMMA) having a block of styrene unit and a block of methyl methacrylate unit already synthesized in a narrow dispersion state by living anionic polymerization and the like and then by partially substituting the styrene units. Accordingly, it is possible to use a block copolymer which maintains a narrow dispersion state and has an increased pro-hydrophobic difference. As a result, the phase separation performance can be further enhanced.

Method for Producing Structure Including Phase-Separated Structure

The method for producing a structure including a phase-separated structure according to the embodiment includes a step of applying a resin composition for forming a phase-separated structure of the above embodiment on a support to form a layer including a block copolymer (hereinafter, referred to as "step (i)") and a step of phase-separating layer including the block copolymer (hereinafter, referred to as "step (ii)").

Hereinafter, a method for producing a structure including a phase-separated structure will be described in detail with reference to FIG. 1. However, the present invention is not limited thereto.

FIG. 1 shows an embodiment of a method for producing a structure including a phase-separated structure.

In the embodiment shown in FIG. 1, first, a brush layer 2 is formed by applying a brush composition on a support 1 (FIG. 1 (I)).

Next, the layer (BCP layer) 3 including the (BCP) component is formed by applying the resin composition for forming a phase-separated structure of the above-described embodiment on the brush layer 2 (FIG. 1 (II); the above, step (i)).

Next, the BCP layer 3 is phase-separated into the phase 3a and the phase 3b by heating and annealing treatment (FIG. 1 (III); step (ii)).

According to the production method of this embodiment, that is, the production method including the step (i) and the step (ii), the structure 3' including the phase-separated structure is produced on the support 1 on which the brush layer 2 is formed.

Step (i)

In the step (i), the BCP layer 3 is formed by applying a resin composition for forming a phase-separated structure on the support 1.

In the embodiment shown in FIG. 1, first, the brush layer 2 is formed by applying the brush composition on the support 1.

By providing the brush layer 2 on the support 1, a hydrophilic/hydrophobic balance between the surface of the support 1 and the layer (BCP layer) 3 including the block copolymer can be achieved.

That is, in a case where the brush layer 2 includes a resin component having the constituent unit constituting the block (b1), the adhesiveness between the phase having the block (b1) of the BCP layer 3 and the support 1 is enhanced. In a case where the brush layer 2 includes a resin component having the constituent unit constituting the block (b2), the adhesiveness between the phase having the block (b2) of the BCP layer 3 and the support 1 is enhanced.

Accordingly, a lamella structure oriented in the direction perpendicular to the surface of the support 1 is likely to be formed due to the phase separation of the BCP layer 3.

Brush Composition:

A resin composition can be used as a brush composition.

The resin composition for the brush composition can be appropriately selected from the resin compositions known in the related art used for forming a thin film depending on the type of the block constituting the (BCP) component.

The resin composition for the brush composition may be, for example, a thermopolymerizable resin composition or may be a photosensitive resin composition such as a positive-type resist composition or a negative-type resist composition. A non-polymerizable film formed by applying a compound being a surface treating agent may be used as a brush layer. For example, a siloxane-based organic monomolecular film formed by applying phenethyltrichlorosilane, octadecyltrichlorosilane, hexamethyldisilazane, or the like as a surface treating agent can also be suitably used as a brush layer.

Examples of such a resin composition include a resin composition including a resin having any of the constituent units constituting each of the block (b1) and the block (b2), a resin composition including a resin having both each block constituting the (BCP) component and a constituent unit having a high affinity, and the like.

As a resin composition for the brush composition, for example, a composition including a resin having both styrene and methyl methacrylate as a constituent unit and a compound or a composition including both a site having a high affinity with styrene such as an aromatic ring and a site having a high affinity with methyl methacrylate (such as a highly polar functional group) are preferably used.

As a resin having both styrene and methyl methacrylate as a constituent unit, a random copolymer of styrene and methyl methacrylate, an alternating polymer of styrene and methyl methacrylate (the polymer in which each monomer is alternately copolymerized), and the like can be exemplified.

In addition, as a composition including both a site having a high affinity with styrene and a site having a high affinity with methyl methacrylate, for example, a composition having a resin obtained by polymerizing at least, as a monomer, a monomer having an aromatic ring and a monomer having a high polarity functional group can be exemplified. As the monomer having an aromatic ring, a monomer having an aryl group obtained by removing a hydrogen atom from an aromatic hydrocarbon ring, such as a phenyl group, a biphenyl group, a fluorenyl group, a naphthyl group, an anthryl group, and a phenanthryl group, or a heteroaryl group in which carbon atoms constituting the ring of these groups are partially substituted with a hetero atom such as an oxygen atom, a sulfur atom or a nitrogen atom can be exemplified. In addition, as a monomer having a highly polar functional group, a monomer having a trimethoxysilyl group, a trichlorosilyl group, an epoxy group, a glycidyl group, a carboxy group, a hydroxyl group, a cyano group, a hydroxyalkyl group in which the hydrogen atoms of the alkyl group are partially substituted with a hydroxy group, and the like can be exemplified.

Further, as a compound including both a site having a high affinity with styrene and a site having a high affinity with methyl methacrylate, a compound including both an aryl group such as phenethyltrichlorosilane and a highly polar functional group, or a compound including both an alkyl group such as an alkylsilane compound and a highly polar functional group, and the like can be exemplified.

The resin composition for the brush composition can be produced by dissolving the above-mentioned resin in a solvent.

As such a solvent, any solvent may be used as long as it can dissolve the respective components to be used and form a homogeneous solution. For example, the same organic solvent components as exemplified in the description of the resin composition for forming a phase-separated structure of the above-described embodiment can be exemplified.

The type of the support 1 is not particularly limited as long as the resin composition can be applied on its surface. For example, a substrate made of an inorganic material such as a metal (silicon, copper, chromium, iron, and aluminum), glass, titanium oxide, silica or mica; a substrate made of an oxide such as $SiO_2$; a substrate made of a nitride such as SiN; a substrate made of an oxynitride such as SiON; and a substrate made of an organic material such as acryl, polystyrene, cellulose, cellulose acetate, phenolic resin, and the like can be exemplified. Among these, a metal substrate is preferable, and for example, a structure of a lamella structure is likely to be formed in a silicon substrate (Si substrate) or a copper substrate (Cu substrate). Among these, a Si substrate is particularly preferable.

The size and shape of the support 1 are not particularly limited. The support 1 is not necessarily required to have a smooth surface, and substrates of various shapes can be appropriately selected. For example, a substrate having a curved surface, a flat surface having an uneven surface, and a substrate with flaky shape can be exemplified.

An inorganic and/or organic film may be provided on the surface of the support 1.

As an inorganic film, an inorganic antireflection film (inorganic BARC) can be exemplified. As an organic film, an organic antireflection film (organic BARC) can be exemplified.

The inorganic film can be formed, for example, by applying an inorganic antireflection film composition such as a silicon-based material on a support and by baking the film, and the like.

For example, the organic film is formed by applying a material for forming an organic film in which a resin component constituting the film is dissolved in an organic solvent on a substrate using a spinner or the like and by baking the film under heating conditions of preferably 200° C. to 300° C., preferably for 30 to 300 seconds and more preferably for 60 to 180 seconds. The material for forming this organic film does not necessarily need to have sensitivity to light or electron beams such as a resist film, and may or may not have sensitivity. Specifically, a resist or a resin generally used for the production of a semiconductor element or a liquid crystal display element can be used.

In addition, it is preferable that the material for forming an organic film is a material capable of forming an organic film which can be subjected to etching, particularly dry-etched so that the organic film can be etched through the pattern which is made of the block copolymer, formed by processing the BCP layer 3 and the pattern can be transferred on the organic film to form an organic film pattern. Among these, a material capable of forming an organic film capable of being subjected to etching such as oxygen plasma etching is preferable. Such a material for forming an organic film may be a material used for forming an organic film such as organic BARC in the related art. For example, the ARC series manufactured by NISSAN CHEMICAL INDUS- TRIES, LTD., the AR series manufactured by Rohm and Haas Japan Ltd., and the SWK series manufactured by TOKYO OHKA KOGYO CO., LTD. and the like can be exemplified.

The method for forming the brush layer 2 by applying the brush composition on the support 1 is not particularly limited and the brush layer can be formed by a known method in the related art.

For example, the brush layer 2 can be formed by applying the brush composition on the support 1 by a known method in the related art such as using a spin coating or a spinner to form a coating film, and drying the coating film.

As a method for drying the coating film, any method for drying the coating film may be used as long as the solvent included in the brush composition can be volatilized, and for example, a method for baking the coating film can be exemplified. In this case, the baking temperature is preferably 80° C. to 300° C., more preferably 180° C. to 270° C., and still more preferably 220° C. to 250° C. The baking time is preferably 30 to 500 seconds and more preferably 60 to 400 seconds.

The thickness of the brush layer 2 after drying the coating film is preferably about 10 to 100 nm and more preferably about 40 to 90 nm.

The surface of the support 1 may be cleaned in advance before forming the brush layer 2 on the support 1. The coatability of the brush composition is improved by cleaning the surface of the support 1.

As the cleaning treatment method, known methods in the related art can be used, and examples thereof include oxygen plasma treatment, ozone oxidation treatment, acid alkali treatment, chemical modification treatment, and the like.

After the brush layer 2 is formed, the brush layer 2 may be rinsed with a rinsing liquid such as a solvent, if necessary. Since the uncrosslinked portion of the brush layer 2 is removed by the rinsing, the affinity with at least one block constituting the block copolymer is improved, and therefore, a phase-separated structure having a lamella structure oriented in the direction perpendicular to the surface of the support 1 is likely to be formed.

The rinsing liquid may be any one as long as it can dissolve the uncrosslinked portion and may be a solvent such as propylene glycol monomethyl ether acetate (PGMEA), propylene glycol monomethyl ether (PGME), ethyl lactate (EL) or a commercially available thinner liquid.

After the cleaning, post-baking may be performed in order to volatilize the rinsing liquid. The temperature condition of the post-baking is preferably from 80° C. to 300° C., more preferably from 100° C. to 270° C., and still more preferably from 120° C. to 250° C. The baking time is preferably 30 to 500 seconds and more preferably 60 to 240 seconds. The thickness of the brush layer 2 after such post-baking is preferably about 1 to 10 nm and more preferably about 2 to 7 nm.

Next, the layer (BCP layer) 3 including the (BCP) component is formed on brush layer 2.

The method for forming the BCP layer 3 on the brush layer 2 is not particularly limited. For example, a method for forming the coating film by applying a resin composition for forming a phase-separated structure of the above-described embodiment on the brush layer 2 by a known method in the related art such as using a spin coating or a spinner to form a coating film and by drying the coating film can be exemplified.

The thickness of the BCP layer 3 may be a thickness sufficient to cause phase separation, and the thickness is preferably from 20 to 100 nm and more preferably from 30 to 80 nm, in consideration of the type of the support 1, the structure period size of the phase-separated structure to be formed, or the uniformity of the nanostructure.

For example, in a case where the support 1 is a Si substrate, the thickness of the BCP layer 3 is preferably adjusted to 10 to 100 nm and more preferably 30 to 80 nm.

Step (ii)

In the step (ii), the BCP layer 3 formed on the support 1 is phase-separated.

By heating to perform an annealing treatment of the support 1 after step (i), a phase-separated structure is formed so that at least a part of the surface of the support 1 is exposed by selective removal of the block copolymer. That is, a structure 3' including a phase-separated structure which is phase-separated into a phase 3$a$ and a phase 3$b$ is produced on the support 1.

The annealing treatment is preferably performed under the temperature condition of being equal to or higher than the glass transition temperature of the (BCP) component used and lower than the thermal decomposition temperature. For example, in a case where the block copolymer is polystyrene-polymethyl methacrylate (PS-PMMA) block copolymer (weight average molecular weight of 5,000 to 100,000), the temperature is preferably 180° C. to 270° C., more preferably 200° C. to 270° C., and still more preferably 220° C. to 260° C.

The heating time is preferably 30 to 3600 seconds, more preferably 30 to 1,000 seconds, still more preferably 30 to 500 seconds, and particularly preferably 30 to 100 seconds.

In addition, it is preferable that the annealing treatment can be performed in a gas having low reactivity such as nitrogen.

According to the method for producing a structure including a phase-separated structure of the embodiment described above, since the resin composition for forming a phase-separated structure of the above embodiment is used, a structure having further improved phase separation performance can be obtained.

In addition, according to a structure including a phase-separated structure of the present embodiment, it is possible to produce a support having nanostructures whose positions and orientations are more freely designed on the surface of the support.

For example, according to the method for producing a structure including the phase-separated structure of the present embodiment, the structure to be formed tends to have a phase-separated structure consisting of a lamella structure.

Optional Step

The method for producing a structure including a phase-separated structure is not limited to the above-described embodiment and may have steps (optional steps) in addition to step (i) and step (ii).

This optional step includes a step (hereinafter, referred to as "step (iii)") of selectively removing a phase having at least one block of the block (b1) and the block (b2) constituting the (BCP) component of the BCP layer 3, a step of forming a guide pattern, and the like.

Regarding Step (iii)

In the step (iii), the phase having at least one block of the block (b1) and the block (b2) constituting the (BCP) component of the BCP layer formed on the brush layer 2 is selectively removed. As a result, a fine pattern (a polymer nanostructure) is formed.

As a method for selectively removing the phase having blocks, a method for performing oxygen plasma treatment on the BCP layer, a method for performing hydrogen plasma treatment and the like can be exemplified.

For example, by performing oxygen plasma treatment, hydrogen plasma treatment or the like on the BCP layer after the phase separation of the BCP layer including the (BCP) component, the phase having the block (b1) is not selectively removed. The phase having the block (b2) is selectively removed.

Figure 2:
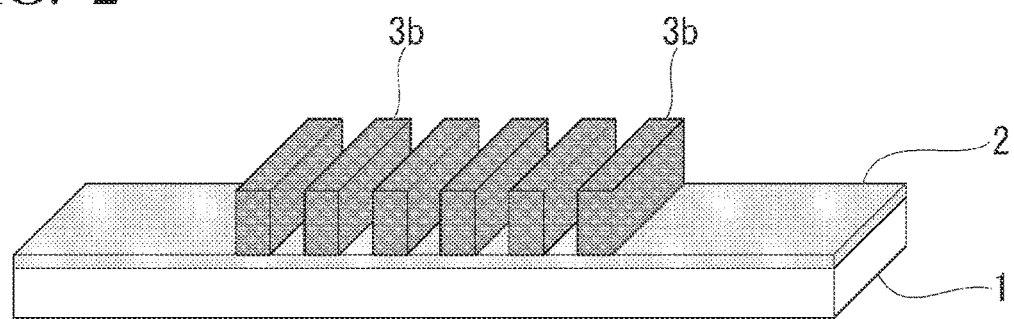
FIG. 2 is a diagram for explaining an example of an embodiment of an optional step.

FIG. 2 shows an example of an embodiment of step (iii).

In the embodiment shown in FIG. 2, in a case where the phase 3a is selectively removed and a pattern (polymer nanostructure) from the separated phase 3b is formed by performing oxygen plasma treatment on the structure 3' produced on the support 1 in step (ii). In this case, the phase 3b is a phase having the block (b1) and the phase 3a is a phase having the block (b2).

The support 1 having the patterns formed by the phase separation of the BCP layer 3 having the (BCP) component as described above can be used as it is, but the shape of the patterns (polymer nanostructure) of the support 1 may be changed by further heating.

The temperature condition for heating is equal to or higher than the glass transition temperature of the block copolymer to be used and is preferably lower than the thermal decomposition temperature. In addition, the heating is preferably performed in a gas having low reactivity such as nitrogen.

Regarding Guide Pattern Forming Step

In the method for producing a structure including a phase-separated structure, a step (guide pattern forming step) of forming a guide pattern on the brush layer may be provided between the above-described step (i) and step (ii). This makes it possible to control the array structure of the phase-separated structures.

For example, even with respect to a block copolymer in which a random fingerprint-shaped phase-separated structure is formed in a case where the guide pattern is not provided, a phase-separated structure oriented along the groove can be obtained by providing a groove structure of a resist film on the surface of the brush layer. According to such a principle, a guide pattern may be provided on the brush layer 2. Further, in the case where the surface of the guide pattern has an affinity with any of the blocks constituting the (BCP) component, a phase-separated structure having a lamella structure oriented in the direction perpendicular to the surface of the support is likely to be formed.

The guide pattern can be formed using, for example, a resist composition.

As the resist composition for forming the guide pattern, generally, those having the affinity with any of the blocks constituting the (BCP) component can be appropriately selected for use from the resist compositions used for forming resist patterns or modified products thereof. The resist composition may be any of a positive-type resist composition for forming a positive-type pattern in which the exposed area of the resist film is dissolved and removed and a negative-type resist composition for forming a negative-type pattern in which the unexposed area of the resist film is dissolved and removed, and the composition is preferably a negative-type resist composition. As the negative-type resist composition, for example, a resist composition including an acid generator, and a base material component in which the solubility in a developing solution including an organic solvent by the action of an acid is decreased by the action of an acid, and the base material component includes a resin component having a constituent unit which is decomposed by the action of an acid to increase the polarity is preferable.

After the BCP composition is poured on the brush layer on which the guide pattern is formed, an annealing treatment is performed to cause phase separation. Therefore, as the resist composition for forming the guide pattern, it is preferable that the composition can form a resist film excellent in solvent resistance and heat resistance can be formed.

Block Copolymer

The block copolymer of the present embodiment has a block (b1) formed of a repeating structure of styrene units partially substituted with a constituent unit represented by the following General Formula (c1) and a block (b2) having a repeating structure of methyl methacrylate units.

(c1)

[In the formula, R is a hydrogen atom or a methyl group. $R^{c0}$ is a hydrophobic functional group.]

The block copolymer of the present embodiment is the same block copolymer as the above-mentioned (BCP) component.

Examples of the block copolymer include a block copolymer having a block (b1) formed of a repeating structure of styrene units, the block (b1) being partially substituted with a constituent unit represented by the following General Formula (c1) and a block (b2) having a repeating structure of methyl methacrylate units.

Method for Producing Block Copolymer

The block copolymer of the present embodiment can be produced, for example, by a production method (first to third production methods) including the following steps.

First Production Method

The first production method is a production method having the following steps.

Step (p1): A step of polymerizing styrene and methyl methacrylate to obtain a block copolymer (PS-b-PMMA)

Step (p2): A step of reacting the obtained block copolymer with a compound having a hydrophobic functional group ($R^{c0}$)

Step (p1):

For the polymerization of styrene and methyl methacrylate, living polymerization is preferable from the fact that a block copolymer (PS-b-PMMA) can be easily obtained. As a preferable living polymerization method, living anionic polymerization and living radical polymerization can be exemplified, and living anionic polymerization is particularly preferable since the narrow dispersion can be further achieved.

Step (p2):

The compound having a hydrophobic functional group ($R^{c0}$) may be a compound capable of introducing a hydrophobic functional group ($R^{c0}$) into a styrene unit, and examples thereof include alcohols having a hydrophobic functional group.

Specific examples of the alcohol having the hydrophobic functional group include 1-adamantanol, 2-methyl-2-adamantanol, and 3,5-dimethyl-1-adamantanol.

As a step (p2), specifically, a method for obtaining a (BCP) component by reacting the block copolymer (PS-b-PMMA) with an alcohol having a hydrophobic functional group ($R^{co}$) in the presence of an acidic catalyst (BCP) (Friedel-Crafts alkylation reaction) can be exemplified.

Examples of the acidic catalyst include inorganic acids such as hydrochloric acid, sulfuric acid, and phosphoric acid; organic acids such as methanesulfonic acid, p-toluenesulfonic acid, and trifluoromethanesulfonic acid; Lewis acids such as boron trifluoride, aluminum chloride, and zinc chloride.

In the step (p2), the reaction temperature of the block copolymer and the compound having a hydrophobic functional group ($R^{co}$) is preferably 1 to 100° C. and more preferably 10 to 80° C.

In the step (p2), the reaction time of the block copolymer and the compound having a hydrophobic functional group ($R^{co}$) is preferably 30 minutes to 18 hours and more preferably 30 minutes to 5 hours.

Second Production Method

The second production method is a production method having the following steps.

Step (p1): A step of polymerizing styrene and methyl methacrylate to obtain a block copolymer (PS-b-PMMA)

Step (p2): A step of reacting the obtained block copolymer with a compound having a hydrophobic functional group ($R^{co}$)

Step (p3): A step of reacting the obtained block copolymer with a compound having a hydrophilic functional group) ($R^{ho}$)

The steps (p1) and (p2) are the same as the steps (p1) and (p2) in the first production method described above.

Step (p3):

As a compound having a hydrophilic functional group ($R^{ho}$), any compound may be used as long as it can introduce a hydrophilic functional group ($R^{ho}$) into the "—OCH$_3$" moiety of the methyl methacrylate unit, and examples thereof include monoethanolamine and ethylene glycol.

In the step (p3), the reaction temperature of the block copolymer and the compound having a hydrophobic functional group ($R^{co}$) is preferably 50 to 150° C. and more preferably 80 to 120° C.

In the step (p3), the reaction time of the block copolymer and the compound having a hydrophobic functional group ($R^{co}$) is preferably 1 to 18 hours, more preferably 6 to 12 hours.

Third Production Method

The third production method is a production method having the following steps.

Step (p1): step of obtaining a block copolymer (hereinafter, referred to as "block copolymer precursor") which has a block (b1) having a repeating structure of a styrene unit and a block (b2) having a repeating structure of a methyl methacrylate unit, in which the block (b2) is disposed at least at one terminal portion.

Step (p2): A step of reacting the obtained block copolymer precursor with a compound having a hydrophobic functional group ($R^{co}$)

Step (p4): step of reacting a block copolymer obtained in the step (p2) with a compound having a hydroxy group or a titanium alkoxide of a compound having a hydroxy group to obtain a block copolymer Step (p1'):

The block copolymer precursor can be obtained by, for example, conducting a polymerization reaction of a monomer (for example, styrene) that induces a repeating structure of styrene units, then adding a monomer (methyl methacrylate) that induces a repeating structure of a methyl methacrylate unit in a polymerization reaction solution, and further performing the polymerization reaction. Alternatively, it can be obtained by performing the polymerization reaction of methyl methacrylate, then adding a monomer (for example, styrene) that induces a repeating structure of a styrene unit to the polymerization reaction solution, and further performing the polymerization reaction. As the polymerization reaction, living polymerization is preferable because it is easy to synthesize with narrow dispersion. As a preferable living polymerization method, living anionic polymerization and living radical polymerization can be exemplified, and living anionic polymerization is particularly preferable since the narrow dispersion can be further achieved.

The step (p2) are the same as the step (p2) in the first production method described above.

Step (p4):

The compound having a hydroxy group is not particularly limited as long as it may be a compound capable of transesterification with the "—OCH$_3$" site of the methyl methacrylate unit. A compound having a hydroxy group can be represented by $R^{e0}$—OH. $R^{e0}$ in the above formula represents a hydrocarbon group which may contain a hetero atom, and is the same as $R^{e0}$ in General Formula (e1). Hereinafter, the compound having a hydroxy group is also referred to as $R^{e0}$—OH.

The reaction between the block copolymer precursor and $R^{e0}$—OH can be performed in the presence of titanium alkoxide of $R^{e0}$—OH (Ti(OR$^{e0}$)$_4$) in an organic solvent. An example of the organic solvent is toluene. The reaction can be performed, for example, at 80° C. to 120° C. and preferably 90° C. to 110° C. for 15 to 30 hours, preferably 20 to 25 hours. After the reaction, a small amount of water may be added, and the reaction may be further performed at room temperature for about 20 to 40 minutes.

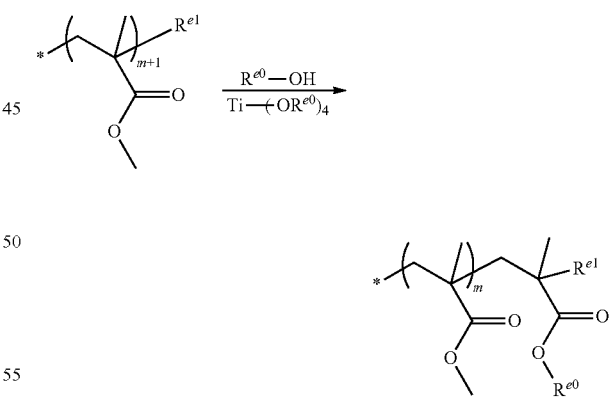

[In the formula, $R^{e0}$, $R^{e1}$, and m are the same as $R^{e0}$, $R^{e1}$, and m in General Formula (b2e-1), respectively. * represents a bond bonded to the carbon atom at an α-position of a styrene unit of an adjacent block (b1).]

In addition, the reaction between the block copolymer precursor and Ti(OR$^{e0}$)$_4$) can be performed in an organic solvent under the same temperature conditions and reaction time as described above. An example of the organic solvent is toluene.

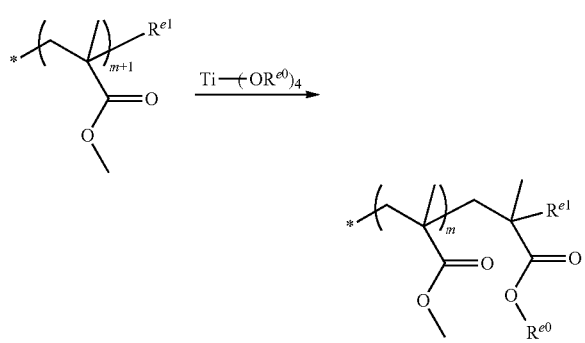

[In the formula, $R^{e0}$, $R^{e1}$, and m are the same as $R^{e0}$, $R^{e1}$, and m in General Formula (b2e-1), respectively. * represents a bond bonded to the carbon atom at an α-position of an adjacent constituent unit.]

After the above reaction, dilution with an organic solvent such as tetrahydrofuran, filtration, concentration, dialysis and the like are performed to obtain a block copolymer.

$Ti(OR^{e0})_4$ can be obtained, for example, by reacting tetraisopropyl orthotitanate $(Ti(OiPr)_4)$ with $R^{e0}$—OH in an organic solvent. An example of the organic solvent is toluene. The reaction can be performed under an argon atmosphere, and the reaction temperature can be 60° C. to 100° C. and preferably 70° C. to 90° C. The reaction time can be 30 to 90 minutes, and more preferably 40 to 80 minutes. After the reaction, $Ti(OR^{e0})_4$ can be obtained by removing the organic solvent by filtration under reduced pressure or the like.

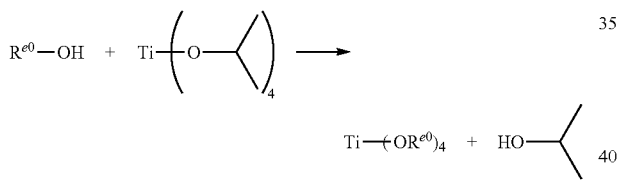

The block copolymer in the embodiment may have a step of reacting a further compound with the block copolymer obtained in the step (p2). For example, in a case where $R^{e0}$ in $R^{e0}$—OH has a reactive functional group, a further compound can be reacted with the reactive functional group. Examples of the reactive functional group include, but are not limited to, an azido group (—$N_3$), a hydroxyl group (—OH), an amino group (—$NH_3$), an ethynyl group (—CCH), and the like.

The reaction of the further compound with the reactive functional group can be performed according to a conventional method depending on the type of the reactive functional group. For example, in a case where $R^{e0}$ has an azido group, a compound having an ethynyl group can be reacted as a further compound. In a case where $R^{e0}$ has an ethynyl group, a compound having an azido group can be reacted as a further compound. In a case where $R^{e0}$ has a hydroxyl group or an amino group, a compound having a carboxy group or the like can be reacted as a further compound.

According to the above-mentioned production methods (first production method to third production method), a block copolymer in which narrow dispersion is achieved, and the pro-hydrophobic difference between the hydrophobic block portion and the hydrophilic block portion in the block copolymer is further increased can be easily obtained.

For example, a block copolymer in which a polydispersity (Mw/Mn) is preferably 1.01 to 1.10, more preferably 1.01 to 1.05, and still more preferably 1.01 to 1.02 can be easily obtained.

EXAMPLES

Hereinafter, the present invention will be described in more detail with reference to examples, but the present invention is not limited to the following examples.

Synthesis Example of Block Copolymer (B1)

In a glove box, under an Ar atmosphere, 207 mg of block copolymer (1) having a block of styrene and a block of methyl methacrylate (PS-b-PMMA (1)) [Mn: PS10,000, PMMA10,000, total 20,000; PS/PMMA composition ratio (mass ratio) 50/50; polydispersity (Mw/Mn) 1.02] (1.00 mmol (equivalent to styrene unit)) and 45.7 mg (0.30 mmol) of 1-adamantanol were put in an eggplant-shaped flask and dissolved in 10 mL of dichloromethane.

In another flask, 10 mL of dichloromethane and 39.8 µL (0.45 mmol) of trifluoromethanesulfonic acid were mixed to prepare an acidic solution. The acidic solution was added to the eggplant-shaped flask and stirred at room temperature (27° C.) for 1 hour to obtain a reaction mixture. Then, the reaction mixture was purified by precipitating in methanol, and subjected to filtration, vacuum drying, and purification by preparative GPC to obtain a white powdery block copolymer (B1) [Mn: 20170, polydispersity (Mw/Mn) 1.03].

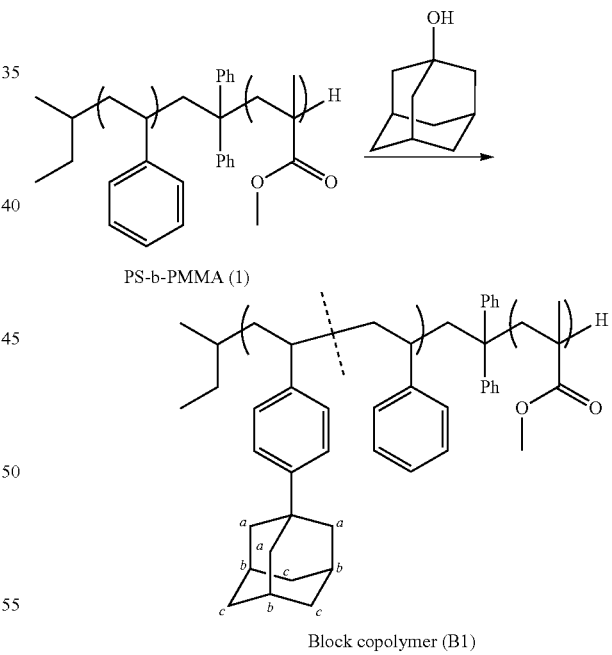

The obtained block copolymer (B1) was subjected to a NMR measurement, and a structure thereof was identified from the following analysis results.

Figure 3:
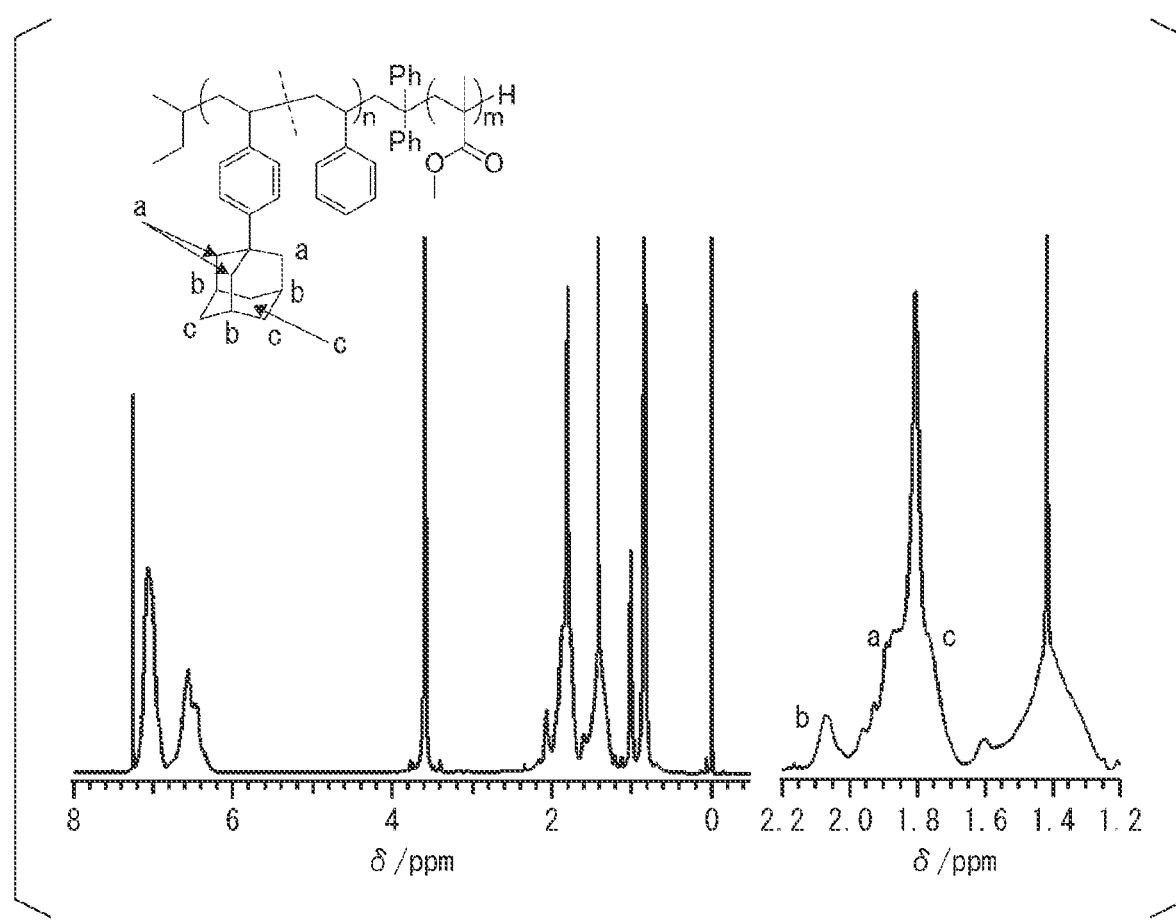
FIG. 3 is a diagram illustrating a $^1$H NMR spectrum of a block copolymer (B1).

FIG. 3 illustrates a $^1$H NMR spectrum of the block copolymer (B1). The $^1$H NMR spectrum on the right side of FIG. 3 is an enlarged range of chemical shifts 2.2 to 1.2 (ppm).

$^1$H NMR (400 MHz, CDCl$_3$): δ (ppm) 7.40-6.20 (br, aromatic), 3.82-3.38 (br, —OCH$_3$, PMMA), 2.13-2.00 (s, 3H, C(b)H), 1.99-0.73 (br, main chain —CH$_2$C—, α-CH$_3$, —CH$_2$CH—, —CH$_2$CH—, PMMA, PS), 1.89-1.84 (br, 6H, C(a)H$_2$), 1.77-1.76 (br, 6H, C(c)H$_2$).

Synthesis Example of Block Copolymers (B2) and (B3)

Block copolymers (B2) and (B3) were produced in the same manner as in the synthesis example of the block copolymer (B1) except that the block copolymer (1) (PS-b-PMMA (1)) was changed to a block copolymer (2) (PS-b-PMMA (2)) [Mn: PS14,000, PMMA14,000, total 28000; PS/PMMA composition ratio (mass ratio) 50/50; polydispersity (Mw/Mn) 1.02], the charging amount of 1-adamantanol and trifluoromethanesulfonic acid were changed, and the proportion of styrene units substituted with hydrophobic functional groups was changed.

Synthesis Example of Block Copolymer (B4)

In a glove box, under an Ar atmosphere, 207 mg of block copolymer having a block of styrene and a block of methyl methacrylate (PS-b-PMMA (1)) [Mn: PS10,000, PMMA10,000, total 20,000; PS/PMMA composition ratio (mass ratio) 50/50; polydispersity (Mw/Mn) 1.02] (1.00 mmol (equivalent to styrene unit)) and 54.1 mg (0.30 mmol) of 3,5-dimethyl-1-adamantanol were put in an eggplant-shaped flask and dissolved in 10 mL of dichloromethane.

In another flask, 10 mL of dichloromethane and 39.8 µL (0.45 mmol) of trifluoromethanesulfonic acid were mixed to prepare an acidic solution. The acidic solution was added to the eggplant-shaped flask and stirred at room temperature (27° C.) for 1 hour to obtain a reaction mixture. Then, the reaction mixture was purified by precipitating in methanol, and subjected to filtration, and vacuum drying to obtain a white powdery block copolymer (B4) [Mn: 20610, polydispersity (Mw/Mn) 1.02].

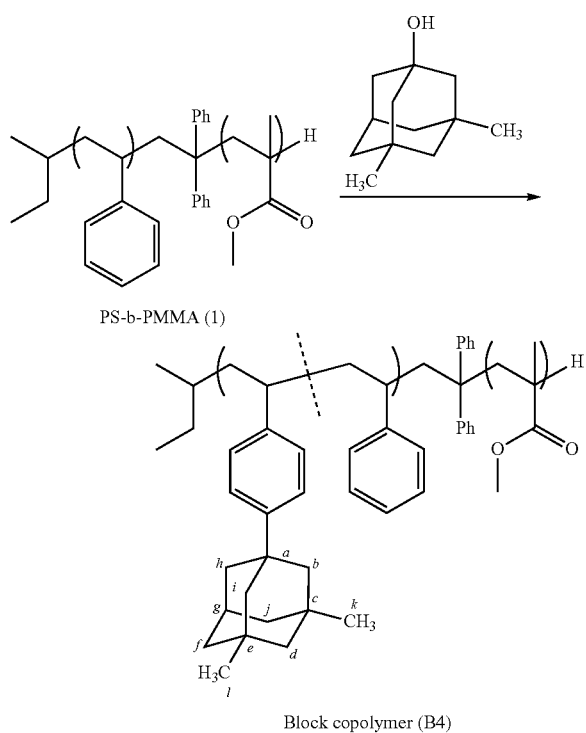

The obtained block copolymer (B4) was subjected to a NMR measurement, and a structure thereof was identified from the following analysis results.

Figure 4:
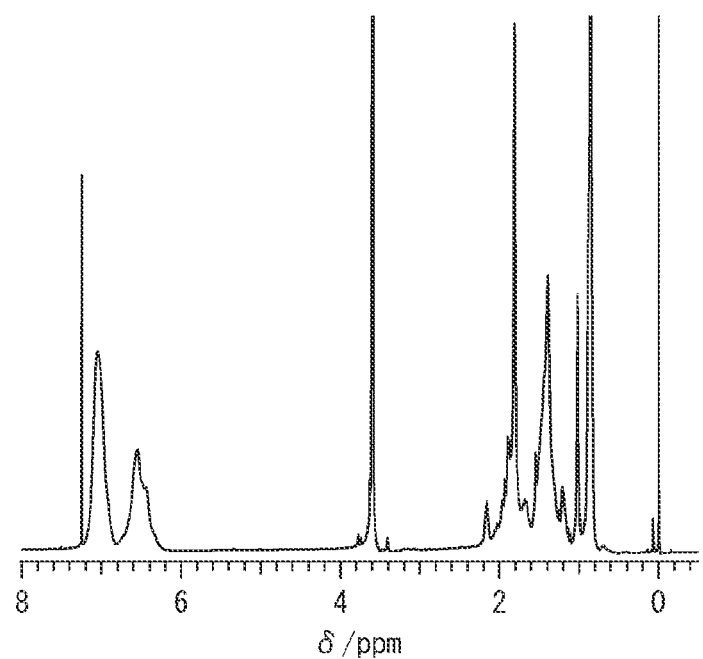
FIG. 4 is a diagram illustrating a $^1$H NMR spectrum of a block copolymer (B4).

FIG. 4 illustrates a $^1$H NMR spectrum of the block copolymer (B4).

Figure 5:
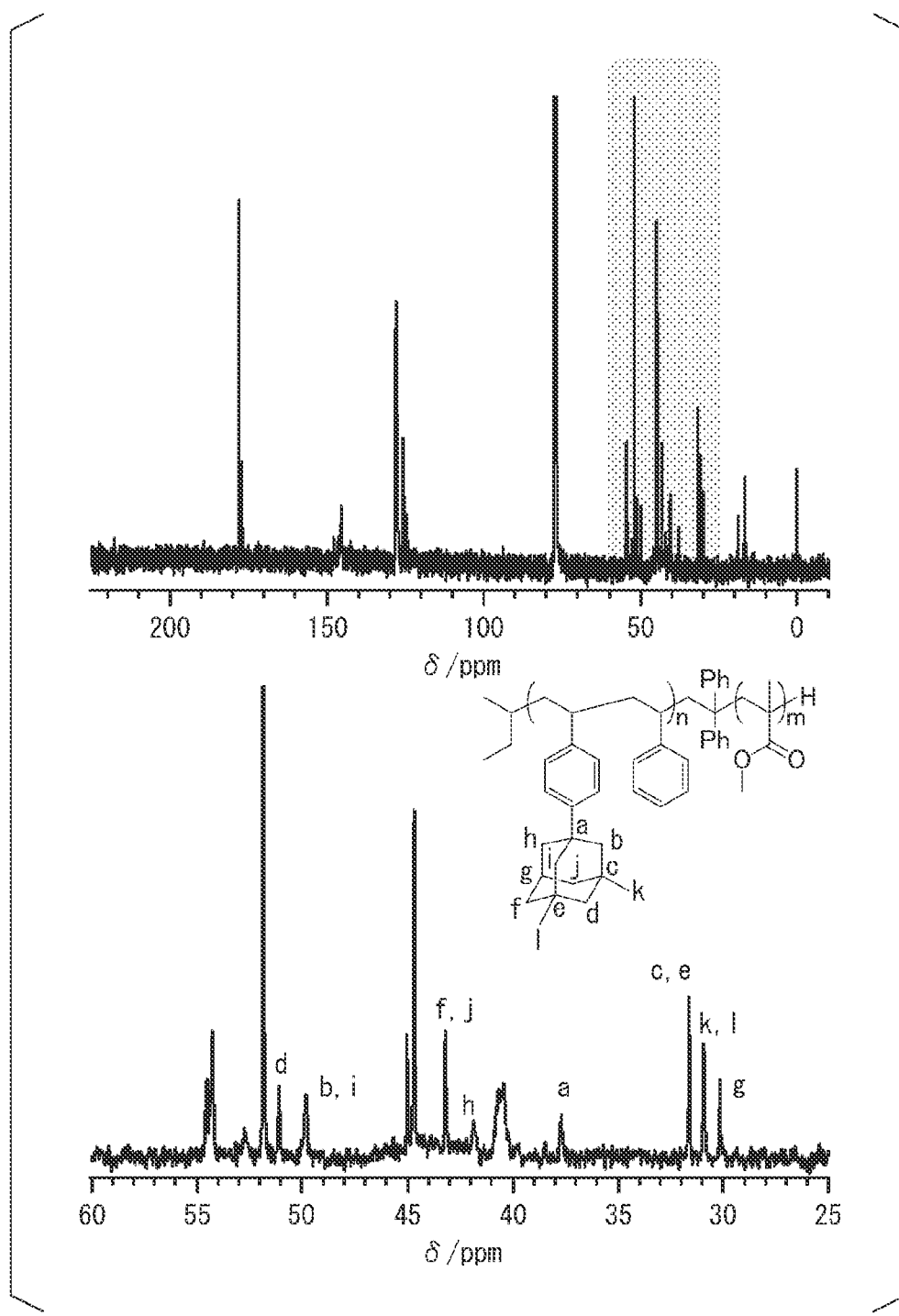
FIG. 5 is a diagram illustrating a $^{13}$C NMR spectrum of a block copolymer (B4).

FIG. 5 illustrates a $^{13}$C NMR spectrum of the block copolymer (B4).

The $^{13}$C NMR spectrum in the lower part of FIG. 5 is an enlarged range of chemical shifts 60 to 25 (ppm).

$^1$H NMR (400 MHz, CDCl$_3$): δ (ppm) 7.40-6.20 (br, aromatic), 3.82-3.38 (br, —OCH$_3$, PMMA), 2.16 (C(g)H), 1.99-0.73 (br, C(b)H$_2$, C(d)H$_2$, C(f)H$_2$, C(h)H$_2$, C(i)H$_2$, C(j)H$_2$, C(k)H$_3$, C(l)H$_3$, main chain —CH$_2$C—, α-CH$_3$, —CH$_2$CH—, —CH$_2$CH—, PMMA, PS).

$^{13}$C NMR (100 MHz, CDCl$_3$): δ (ppm) 178.1, 177.8, 177.0 (side chain, C=O, PMMA), 145.2, 128.0, 125.7, 124.5 (aromatic side chain, PS), 54.7-54.1 (main chain —CH$_2$C—, PMMA), 51.8 (side chain, OCH$_3$, PMMA), 51.0 (Cd), 49.8 (Cb, Ci), 45.0 (main chain —CH$_2$CH—, PS), 44.7 (main chain —CH$_2$C—, PMMA), 43.1 (Cf, Cj), 41.9 (Cb), 40.5 (main chain —CH$_2$CH—, PS), 37.7 (Ca), 31.6 (Cc, Ce), 31.0 (Ck, Cl), 30.0 (Cg), 18.9,16.7 (α-CH$_3$, PMMA).

Synthesis Example of Block Copolymers (B5) and (B6)

Block copolymers (B5) and (B6) were produced in the same manner as in the synthesis example of the block copolymer (B4) except that the charging amount of 3,5-dimethyl-1-adamantanol and trifluoromethanesulfonic acid were changed, and the proportion of styrene units substituted with hydrophobic functional groups was changed.

Synthesis Example of Block Copolymer (B7)

A block copolymer (B7) was produced in the same manner as in the synthesis example of the block copolymer (B4) except that the block copolymer (1) (PS-b-PMMA (1)) was changed to a block copolymer (2) (PS-b-PMMA (2)) [Mn: PS14,000, PMMA14,000, total 28,000; PS/PMMA composition ratio (mass ratio) 50/50; polydispersity (Mw/Mn) 1.02], the charging amount of 3,5-dimethyl-1-adamantanol and trifluoromethanesulfonic acid were changed, and the proportion of styrene units substituted with hydrophobic functional groups was changed.

Regarding the block copolymers (B1) to (B7), Table 1 indicates the charging amount of alcohol and trifluoromethanesulfonic acid (molar ratio to the styrene unit) used for producing the block copolymer, the number average molecular weight (Mn), and the polydispersity (Mw/Mn) in terms of standard polystyrene obtained by the GPC measurement of the obtained block copolymers (B1) to (B7).

TABLE 1

|  | Charging amount of alcohol (molar ratio to styrene unit) | Charging amount of trifluoro-methane-sulfonic acid (molar ratio to styrene unit) | Number average molecular weight (Mn) | Poly-dispersity (Mw/Mn) |
|---|---|---|---|---|
| Block copolymer (B1) | 0.30 | 0.45 | 20170 | 1.03 |
| Block copolymer (B2) | 0.10 | 0.15 | 24450 | 1.02 |

TABLE 1-continued

| | Charging amount of alcohol (molar ratio to styrene unit) | Charging amount of trifluoro-methane-sulfonic acid (molar ratio to styrene unit) | Number average molecular weight (Mn) | Poly-dispersity (Mw/Mn) |
|---|---|---|---|---|
| Block copolymer (B3) | 0.20 | 0.30 | 24050 | 1.03 |
| Block copolymer (B4) | 0.30 | 0.45 | 20610 | 1.02 |
| Block copolymer (B5) | 0.40 | 0.60 | 20040 | 1.03 |
| Block copolymer (B6) | 0.50 | 0.75 | 20080 | 1.03 |
| Block copolymer (B7) | 0.20 | 0.30 | 26300 | 1.03 |

Preparation of Resin Composition

Examples 1 to 7, Comparative Examples 1 and 2

The respective components indicated in Table 2 were mixed and dissolved to prepare a resin composition (solid content concentration of 0.8 mass %).

TABLE 2

| | Resin composition | Block copolymer | Organic solvent component |
|---|---|---|---|
| Example 1 | Resin composition (1) | BCP-1 [100] | (S)-1 [12400] |
| Example 2 | Resin composition (2) | BCP-2 [100] | (S)-1 [12400] |
| Example 3 | Resin composition (3) | BCP-3 [100] | (S)-1 [12400] |
| Example 4 | Resin composition (4) | BCP-4 [100] | (S)-1 [12400] |
| Example 5 | Resin composition (5) | BCP-5 [100] | (S)-1 [12400] |
| Example 6 | Resin composition (6) | BCR-6 [100] | (S)-1 [12400] |
| Example 7 | Resin composition (7) | BCP-7 [100] | (S)-1 [12400] |
| Comparative Example 1 | Resin composition (8) | BCP-8 [100] | (S)-1 [12400] |
| Comparative Example 2 | Resin composition (9) | BCP-9 [100] | (S)-1 [12400] |

Each of the abbreviations in Table 2 has the following meanings. The numerical values in the brackets were the blending amount (parts by mass).
BCP-1: The block copolymer (B1)
BCP-2: The block copolymer (B2)
BCP-3: The block copolymer (B3)
BCP-4: The block copolymer (B4)
BCP-5: The block copolymer (B5)
BCP-6: The block copolymer (B6)
BCP-7: The block copolymer (B7)
BCP-8: PS-b-PMMA (1) [Mn: PS10,000, PMMA10,000, total 20,000; PS/PMMA composition ratio (mass ratio) 50/50; polydispersity (Mw/Mn) 1.02]
BCP-9: PS-b-PMMA (2) [Mn: PS14,000, PMMA14,000, total 28,000; PS/PMMA composition ratio (mass ratio) 50/50; polydispersity (Mw/Mn) 1.02].
(S)-1: Propylene Glycol Monomethyl Ether Acetate (PGMEA)

Production of Structure including Phase-separated Structure

A structure including a phase-separated structure was obtained by using the resin compositions (1) to (9) according to the production method including the following step (i) and step (ii). Further, a pattern was formed by the step (iii).

Step (i):

On a Si substrate on which the organic film was formed, the resin composition of each example was spin-coated so as to have a film thickness of 24 nm, thereby forming a resin composition layer (layer including a block copolymer).

Step (ii):

The resin composition layer formed on the Si substrate was baked at 240° C. for 60 seconds to form a phase formed of the block (b1) and a phase formed of the block (b2) (phase-separated structure).

Step (iii):

Oxygen plasma treatment (200 mL/min, 40 Pa, 40° C., 200 W, 20 seconds) was performed on the Si substrate on which the phase-separated structure was formed by using TCA-3822 (manufactured by TOKYO OHKA KOGYO CO., LTD.) and thus a block (b2) phase was selectively removed.

Evaluation of Phase-Separated State

The surface (phase-separated state) of the obtained substrate was observed with a scanning electron microscope SEM (SU8000, manufactured by Hitachi High-Technologies Corporation).

As a result of such observation, the phase separation state was evaluated based on the following evaluation criteria. The results are indicated in Table 3 as "phase separation state".

A: Those in which phase separation of lamella was expressed
B: Those in which phase separation other than lamella was expressed
C: Those in which phase separation was not expressed Evaluation of Period of Structure (nm)

Regarding the block copolymers (B1) to (B7), the measurement was performed by an X-ray small angle scattering (SAXS) method, and the period (nm) of the structure obtained by each block copolymer was calculated from the primary scattering peak of the SAXS pattern curve. The results were indicated in Table 3.

TABLE 3

| | Resin composition | Number average molecular weight of block copolymer (Mn) | Phase separation performance | Period (nm) |
|---|---|---|---|---|
| Example 1 | Resin composition (1) | 20170 | B | 16.7 |
| Example 2 | Resin composition (2) | 24450 | A | 19.8 |
| Example 3 | Resin composition (3) | 24050 | A | 20.8 |
| Example 4 | Resin composition (4) | 20610 | B | 17.2 |
| Example 5 | Resin composition (5) | 20040 | B | 17.6 |
| Example 6 | Resin composition (6) | 20080 | B | 17.9 |
| Example 7 | Resin composition (7) | 26300 | A | 20.8 |
| Comparative Example 1 | Resin composition (8) | 20000 | C | — |
| Comparative Example 2 | Resin composition (9) | 28000 | C | — |

As indicated in Table 3, in Comparative Examples 1 and 2 using a block copolymer having a block of styrene not modified with a specific hydrophobic functional group and a block of methyl methacrylate, the phase separation did not occur in a case where the Mn of the block copolymer was 20,000 and 28,000.

On the other hand, in a case where the block copolymer of the resin composition (8) of Comparative Example 1 was changed to PS-b-PMMA (3) [Mn: PS21,000, PMMA21,000, total 42,000; PS/PMMA composition ratio (mass ratio) 50/50; polydispersity (Mw/Mn) 1.02], the phase separation occurred (period of structure 23.7 nm). The phase-separated state was lamella.

In Examples 1 to 7 using PS-b-PMMA in which the styrene unit was modified with a specific hydrophobic functional group, it can be confirmed that the phase separation occurs even if the Mn of the block copolymer is small. In addition, it can also be confirmed that a phase-separated structure having a shorter period is formed.

In Examples 2, 3 and 7, the phase separation period structure (lamella) of PS-b-PMMA (3) not modified with a specific hydrophobic functional group was maintained even if the Mn of the block copolymer was reduced.

From the above, it can be confirmed that in a case of using the resin compositions of Examples 1 to 7, the phase separation performance can be further enhanced without the need for a new monomer.

While preferred embodiments of the invention have been described and illustrated above, it should be understood that these are exemplary of the invention and are not to be considered as limiting. Additions, omissions, substitutions, and other modifications can be made without departing from the scope of the invention. Accordingly, the invention is not to be considered as being limited by the foregoing description and is only limited by the scope of the appended claims.

EXPLANATION OF REFERENCES

1 . . . Support
2 . . . Brush layer
3 . . . BCP layer
3' . . . Structure
3a . . . Phase
3b . . . Phase

What is claimed is:

1. A method for producing a structure including a phase-separated structure, the method comprising:
applying a resin composition on a support to form a layer including a block copolymer; and
phase-separating the layer including the block copolymer,
wherein the resin composition comprises a block copolymer having a block (b1) formed of a repeating structure of styrene units, the block (b1) being partially substituted with a constituent unit represented by the following General Formula (c1), and a block (b2) having a repeating structure of methyl methacrylate units:

(c1)

wherein R is a hydrogen atom or a methyl group, and $R^{c0}$ is a polycyclic alicyclic hydrocarbon group which may have a substituent.

2. The method according to claim 1, wherein the block copolymer has a number average molecular weight between 25,000 and 40,000.

3. The method according to claim 2, wherein a proportion of the constituent unit represented by the General Formula (c1) in the block copolymer is 1 to 25 mol % with respect to 100 mol % of all constituent units constituting the block copolymer.

4. The method according to claim 1, further comprising selectively removing a phase having at least one type of a block from a phase having a block (b1) and a phase having a block (b2) in the phase-separated layer to form a pattern after the step of phase-separating a layer including the block copolymer.

* * * * *